United States Patent
Tang et al.

(10) Patent No.: US 9,608,119 B2
(45) Date of Patent: Mar. 28, 2017

(54) SEMICONDUCTOR-METAL-ON-INSULATOR STRUCTURES, METHODS OF FORMING SUCH STRUCTURES, AND SEMICONDUCTOR DEVICES INCLUDING SUCH STRUCTURES

(75) Inventors: Sanh D. Tang, Boise, ID (US); Ming Zhang, Boise, ID (US); Andrew M. Bayless, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 99 days.

(21) Appl. No.: 12/715,704

(22) Filed: Mar. 2, 2010

(65) Prior Publication Data

US 2011/0215407 A1 Sep. 8, 2011

(51) Int. Cl.
| | | |
|---|---|---|
| *H01L 23/58* | (2006.01) | |
| *H01L 29/786* | (2006.01) | |
| *H01L 21/762* | (2006.01) | |
| *H01L 21/84* | (2006.01) | |
| *H01L 27/102* | (2006.01) | |
| *H01L 27/108* | (2006.01) | |
| *H01L 27/12* | (2006.01) | |

(Continued)

(52) U.S. Cl.
CPC .. *H01L 29/78642* (2013.01); *H01L 21/76254* (2013.01); *H01L 21/84* (2013.01); *H01L 27/1021* (2013.01); *H01L 27/10802* (2013.01); *H01L 27/12* (2013.01); *H01L 27/24* (2013.01); *H01L 29/7841* (2013.01); *H01L 29/78603* (2013.01); *H01L 29/78645* (2013.01); *H01L 29/78648* (2013.01)

(58) Field of Classification Search
CPC .... H01L 27/1203; H01L 21/84; H01L 23/298
USPC .......... 257/438, 348, 629, 632, 646
See application file for complete search history.

(56) References Cited

U.S. PATENT DOCUMENTS 3,988,771 A 10/1976 Krishna
4,487,639 A 12/1984 Lam et al.
(Continued)

FOREIGN PATENT DOCUMENTS

CN 101621036 1/2010
CN 201180011628.6 6/2014
(Continued)

OTHER PUBLICATIONS

Cho et al., A Novel Capacitor-Less DRAM Cell Using Thin Capacitively-Coupled Thyristor (TCCT), IEEE, 2005, 4 pages.
(Continued)

*Primary Examiner* — Thao X Le
*Assistant Examiner* — Eric Jones
(74) *Attorney, Agent, or Firm* — Wells St. John P.S.

(57) ABSTRACT

Methods for fabricating semiconductor-metal-on-insulator (SMOI) structures include forming an acceptor wafer including an insulator material on a first semiconductor substrate, forming a donor wafer including a conductive material and an amorphous silicon material on a second semiconductor substrate, and bonding the amorphous silicon material of the donor wafer to the insulator material of the acceptor wafer. SMOI structures formed from such methods are also disclosed, as are semiconductor devices including such SMOI structures.

14 Claims, 22 Drawing Sheets

(51) Int. Cl.
*H01L 27/24* (2006.01)
*H01L 29/78* (2006.01)

(56) References Cited

U.S. PATENT DOCUMENTS

| | | | |
|---|---|---|---|
| 5,098,861 A * | 3/1992 | Blackstone | 438/406 |
| 5,102,821 A | 4/1992 | Moslehi | |
| 5,106,776 A | 4/1992 | Shen et al. | |
| 5,260,233 A | 11/1993 | Buti et al. | |
| 5,373,184 A * | 12/1994 | Moslehi | 257/499 |
| 5,378,316 A * | 1/1995 | Franke et al. | 216/2 |
| 5,412,598 A | 5/1995 | Shulman | |
| 5,465,249 A | 11/1995 | Cooper, Jr. et al. | |
| 5,471,039 A | 11/1995 | Irwin, Jr. et al. | |
| 5,510,630 A | 4/1996 | Agarwal et al. | |
| 5,563,084 A | 10/1996 | Ramm et al. | |
| 5,600,160 A | 2/1997 | Hvistendahl | |
| 5,874,760 A | 2/1999 | Burns, Jr. et al. | |
| 5,904,507 A | 5/1999 | Thomas | |
| 5,909,618 A | 6/1999 | Forbes et al. | |
| 5,920,105 A | 7/1999 | Okamoto et al. | |
| 5,930,640 A | 7/1999 | Kenney | |
| 5,936,274 A | 8/1999 | Forbes et al. | |
| 5,963,469 A | 10/1999 | Forbes | |
| 6,017,778 A | 1/2000 | Pezzani | |
| 6,033,957 A | 3/2000 | Burns, Jr. et al. | |
| 6,137,128 A | 10/2000 | Holmes et al. | |
| 6,191,476 B1 | 2/2001 | Takahashi et al. | |
| 6,225,151 B1 | 5/2001 | Gardner et al. | |
| 6,225,165 B1 | 5/2001 | Noble, Jr. et al. | |
| 6,229,161 B1 | 5/2001 | Nemati et al. | |
| 6,245,663 B1 | 6/2001 | Zhao et al. | |
| 6,255,731 B1 | 7/2001 | Ohmi et al. | |
| 6,274,888 B1 | 8/2001 | Suzuki et al. | |
| 6,294,418 B1 | 9/2001 | Noble | |
| 6,303,468 B1 | 10/2001 | Aspar et al. | |
| 6,335,231 B1 | 1/2002 | Yamazaki et al. | |
| 6,335,258 B1 | 1/2002 | Aspar et al. | |
| 6,352,894 B1 | 3/2002 | Goebel et al. | |
| 6,355,501 B1 | 3/2002 | Fung et al. | |
| 6,355,520 B1 | 3/2002 | Park et al. | |
| 6,365,488 B1 | 4/2002 | Liao | |
| 6,391,658 B1 | 5/2002 | Gates et al. | |
| 6,492,662 B2 | 12/2002 | Hsu et al. | |
| 6,559,471 B2 | 5/2003 | Finder et al. | |
| 6,576,944 B2 | 6/2003 | Weis | |
| 6,593,624 B2 | 7/2003 | Walker | |
| 6,600,173 B2 | 7/2003 | Tiwari | |
| 6,627,924 B2 | 9/2003 | Hsu et al. | |
| 6,649,980 B2 | 11/2003 | Noguchi | |
| 6,653,174 B1 | 11/2003 | Cho et al. | |
| 6,690,038 B1 | 2/2004 | Cho et al. | |
| 6,690,039 B1 | 2/2004 | Nemati et al. | |
| 6,713,791 B2 | 3/2004 | Hsu et al. | |
| 6,713,810 B1 | 3/2004 | Bhattacharyya | |
| 6,727,529 B2 | 4/2004 | Nemati et al. | |
| 6,744,094 B2 | 6/2004 | Forbes | |
| 6,756,286 B1 | 6/2004 | Moriceau et al. | |
| 6,764,774 B2 | 7/2004 | Grill et al. | |
| 6,768,156 B1 | 7/2004 | Bhattacharyya | |
| 6,809,044 B1 | 10/2004 | Aspar et al. | |
| 6,812,504 B2 | 11/2004 | Bhattacharyya | |
| 6,815,781 B2 | 11/2004 | Vyvoda et al. | |
| 6,841,813 B2 | 1/2005 | Walker et al. | |
| 6,845,034 B2 | 1/2005 | Bhattacharyya | |
| 6,870,202 B2 | 3/2005 | Oka | |
| 6,881,994 B2 | 4/2005 | Lee et al. | |
| 6,882,008 B1 | 4/2005 | Ohsawa | |
| 6,888,199 B2 | 5/2005 | Nowak et al. | |
| 6,891,205 B1 | 5/2005 | Cho et al. | |
| 6,906,354 B2 | 6/2005 | Hsu et al. | |
| 6,914,286 B2 | 7/2005 | Park | |
| 6,934,209 B2 | 8/2005 | Marr | |
| 6,940,748 B2 | 9/2005 | Nejad et al. | |
| 6,940,761 B2 | 9/2005 | Forbes | |
| 6,946,365 B2 | 9/2005 | Aspar et al. | |
| 6,953,953 B1 | 10/2005 | Horch | |
| 6,958,263 B2 | 10/2005 | Bhattacharyya | |
| 6,958,513 B2 | 10/2005 | Wang | |
| 6,965,129 B1 | 11/2005 | Horch et al. | |
| 6,992,349 B2 | 1/2006 | Lee et al. | |
| 6,995,456 B2 | 2/2006 | Nowak | |
| 7,015,092 B2 | 3/2006 | Jaiprakash et al. | |
| 7,029,956 B2 | 4/2006 | Hsu et al. | |
| 7,052,941 B2 | 5/2006 | Lee | |
| 7,075,146 B2 | 7/2006 | Forbes | |
| 7,081,663 B2 | 7/2006 | Bulucea | |
| 7,115,939 B2 | 10/2006 | Forbes | |
| 7,120,046 B1 | 10/2006 | Forbes | |
| 7,129,538 B2 | 10/2006 | Lee et al. | |
| 7,151,024 B1 | 12/2006 | Forbes | |
| 7,157,771 B2 | 1/2007 | Forbes | |
| 7,158,401 B2 | 1/2007 | Bhattacharyya | |
| RE39,484 E | 2/2007 | Bruel | |
| 7,180,135 B1 | 2/2007 | Ioannou | |
| 7,195,959 B1 | 3/2007 | Plummer et al. | |
| 7,205,185 B2 * | 4/2007 | Dokumaci et al. | 438/197 |
| 7,250,628 B2 | 7/2007 | Bhattacharyya | |
| 7,250,646 B2 | 7/2007 | Walker et al. | |
| 7,268,373 B1 | 9/2007 | Gupta et al. | |
| 7,271,052 B1 | 9/2007 | Forbes | |
| 7,279,740 B2 | 10/2007 | Bhattacharyya et al. | |
| 7,304,327 B1 | 12/2007 | Nemati et al. | |
| 7,323,380 B2 | 1/2008 | Forbes | |
| 7,326,969 B1 | 2/2008 | Horch | |
| 7,338,862 B2 | 3/2008 | Huo et al. | |
| 7,358,120 B2 | 4/2008 | Furukawa et al. | |
| 7,359,229 B2 | 4/2008 | Ferrant et al. | |
| 7,362,609 B2 | 4/2008 | Harrison et al. | |
| 7,368,352 B2 | 5/2008 | Kim et al. | |
| 7,378,325 B2 | 5/2008 | Kaneko | |
| 7,410,867 B2 | 8/2008 | Forbes | |
| 7,415,690 B2 | 8/2008 | Liang et al. | |
| 7,440,310 B2 | 10/2008 | Bhattacharyya | |
| 7,456,439 B1 | 11/2008 | Horch | |
| 7,476,939 B2 | 1/2009 | Okhonin et al. | |
| 7,488,627 B1 | 2/2009 | Nemati et al. | |
| 7,491,608 B2 | 2/2009 | Forbes | |
| 7,518,182 B2 | 4/2009 | Abbott et al. | |
| 7,525,137 B2 | 4/2009 | Walker et al. | |
| 7,538,000 B2 | 5/2009 | Dao | |
| 7,560,336 B2 | 7/2009 | Abbott | |
| 7,579,240 B2 | 8/2009 | Forbes | |
| 7,589,995 B2 | 9/2009 | Tang et al. | |
| 7,592,209 B2 | 9/2009 | Chang | |
| 7,615,436 B2 | 11/2009 | Kouznetsov et al. | |
| 7,619,917 B2 | 11/2009 | Nirschl et al. | |
| 7,629,651 B2 | 12/2009 | Nakajima | |
| 7,663,188 B2 | 2/2010 | Chung | |
| 7,736,969 B2 | 6/2010 | Abbott et al. | |
| 7,786,505 B1 | 8/2010 | Yang et al. | |
| 7,816,728 B2 | 10/2010 | Ho et al. | |
| 7,825,455 B2 | 11/2010 | Lee et al. | |
| 7,838,360 B2 | 11/2010 | Forbes | |
| 7,851,859 B2 | 12/2010 | Tak et al. | |
| 7,883,962 B2 | 2/2011 | Noble | |
| 7,897,440 B1 | 3/2011 | Horch | |
| 7,929,343 B2 | 4/2011 | Tang | |
| 8,018,058 B2 | 9/2011 | Lee | |
| 8,084,316 B2 | 12/2011 | Huo et al. | |
| 8,102,025 B2 | 1/2012 | Ozeki et al. | |
| 8,148,780 B2 | 4/2012 | Tang et al. | |
| 8,501,559 B2 | 8/2013 | Tang et al. | |
| 8,501,581 B2 | 8/2013 | Tang et al. | |
| 8,507,966 B2 | 8/2013 | Tang et al. | |
| 8,518,812 B2 | 8/2013 | Mariani et al. | |
| 8,519,431 B2 | 8/2013 | Nemati et al. | |
| 8,524,543 B2 | 9/2013 | Tang | |
| 8,558,220 B2 | 10/2013 | Schricker et al. | |
| 8,598,621 B2 | 12/2013 | Tang | |
| 8,772,848 B2 | 7/2014 | Zahurak | |
| 2001/0002062 A1 | 5/2001 | Noble, Jr. et al. | |
| 2001/0024841 A1 | 9/2001 | Noble, Jr. et al. | |
| 2001/0025477 A1 | 10/2001 | Hara et al. | |

(56) References Cited

U.S. PATENT DOCUMENTS

| | | |
|---|---|---|
| 2001/0026477 A1 | 10/2001 | Manning |
| 2001/0048119 A1 | 12/2001 | Mizuno et al. |
| 2002/0024152 A1 | 2/2002 | Momoi et al. |
| 2002/0028541 A1 | 3/2002 | Lee et al. |
| 2002/0070454 A1 | 6/2002 | Yasukawa |
| 2002/0079537 A1 | 6/2002 | Houston |
| 2002/0081753 A1 | 6/2002 | Gates et al. |
| 2002/0094619 A1 | 7/2002 | Mandelman et al. |
| 2002/0142562 A1 | 10/2002 | Chan et al. |
| 2002/0158254 A1 | 10/2002 | Hsu et al. |
| 2002/0163019 A1 | 11/2002 | Mohsen |
| 2002/0185684 A1 | 12/2002 | Campbell et al. |
| 2002/0190265 A1 | 12/2002 | Hsu et al. |
| 2002/0190298 A1 | 12/2002 | Alsmeier et al. |
| 2003/0006461 A1 | 1/2003 | Tezuka et al. |
| 2003/0102469 A1* | 6/2003 | Jones ............... H01L 21/02381 257/9 |
| 2003/0164501 A1 | 9/2003 | Suzuki et al. |
| 2003/0211705 A1* | 11/2003 | Tong et al. ................. 438/455 |
| 2003/0223292 A1 | 12/2003 | Nejad et al. |
| 2003/0235710 A1 | 12/2003 | Grill et al. |
| 2004/0007717 A1* | 1/2004 | Yoo ................. H01L 27/11206 257/197 |
| 2004/0022105 A1 | 2/2004 | Ohsawa |
| 2004/0094758 A1* | 5/2004 | Usuda et al. ................. 257/18 |
| 2004/0097022 A1* | 5/2004 | Werkhoven ....... H01L 21/02178 438/149 |
| 2004/0130015 A1* | 7/2004 | Ogihara ................. B41J 2/45 257/678 |
| 2004/0159853 A1 | 8/2004 | Nemati et al. |
| 2004/0174734 A1 | 9/2004 | Forbes |
| 2004/0214379 A1 | 10/2004 | Lee et al. |
| 2004/0233761 A1 | 11/2004 | Schwabe et al. |
| 2004/0262635 A1 | 12/2004 | Lee |
| 2004/0262679 A1 | 12/2004 | Ohsawa |
| 2005/0001232 A1 | 1/2005 | Bhattacharyya |
| 2005/0037582 A1* | 2/2005 | Dennard et al. ............ 438/281 |
| 2005/0059252 A1 | 3/2005 | Dokumaci et al. |
| 2005/0146955 A1 | 7/2005 | Kajiyama |
| 2005/0230356 A1 | 10/2005 | Empedocles et al. |
| 2005/0282318 A1* | 12/2005 | Dao ............... 438/151 |
| 2005/0282356 A1 | 12/2005 | Lee |
| 2006/0034116 A1 | 2/2006 | Lam et al. |
| 2006/0071074 A1* | 4/2006 | Konevecki et al. ......... 235/454 |
| 2006/0082004 A1 | 4/2006 | Parekh et al. |
| 2006/0099776 A1 | 5/2006 | Dupont |
| 2006/0124974 A1 | 6/2006 | Cabral et al. |
| 2006/0125011 A1 | 6/2006 | Chang |
| 2006/0197115 A1 | 9/2006 | Toda |
| 2006/0010056 A1 | 10/2006 | Huo et al. |
| 2006/0227601 A1 | 10/2006 | Bhattacharyya |
| 2006/0249770 A1 | 11/2006 | Huo et al. |
| 2007/0012945 A1 | 1/2007 | Sugizaki |
| 2007/0018166 A1* | 1/2007 | Atanackovic et al. ......... 257/64 |
| 2007/0018223 A1 | 1/2007 | Abbott |
| 2007/0023805 A1 | 2/2007 | Wells et al. |
| 2007/0029607 A1 | 2/2007 | Kouznetzov |
| 2007/0045709 A1 | 3/2007 | Yang |
| 2007/0047364 A1 | 3/2007 | Chuang et al. |
| 2007/0057328 A1 | 3/2007 | Taniguchi et al. |
| 2007/0064342 A1* | 3/2007 | Nakamura ............ B82Y 25/00 360/119.02 |
| 2007/0077694 A1 | 4/2007 | Lee |
| 2007/0080385 A1 | 4/2007 | Kim et al. |
| 2007/0121696 A1* | 5/2007 | Ishii ................. H01L 31/0203 372/99 |
| 2007/0127289 A1 | 6/2007 | Lee |
| 2007/0215954 A1* | 9/2007 | Mouli ................ 257/390 |
| 2007/0252175 A1 | 11/2007 | Tang et al. |
| 2007/0264771 A1 | 11/2007 | Ananthan et al. |
| 2008/0003774 A1 | 1/2008 | Baek |
| 2008/0003778 A1* | 1/2008 | Eyck ................. H01L 21/2007 438/455 |
| 2008/0124867 A1 | 5/2008 | Brown |
| 2008/0128802 A1 | 6/2008 | Huo et al. |
| 2008/0149984 A1 | 6/2008 | Chang et al. |
| 2008/0164528 A1* | 7/2008 | Cohen et al. ............... 257/365 |
| 2008/0211023 A1 | 9/2008 | Shino |
| 2008/0211061 A1* | 9/2008 | Atwater, Jr. et al. ......... 257/615 |
| 2008/0233694 A1* | 9/2008 | Li ................. 438/216 |
| 2008/0237776 A1 | 10/2008 | Abbott |
| 2008/0246023 A1 | 10/2008 | Zeng et al. |
| 2008/0299753 A1* | 12/2008 | Figura et al. ............... 438/591 |
| 2009/0003025 A1 | 1/2009 | Mokhlesi et al. |
| 2009/0010056 A1 | 1/2009 | Kuo et al. |
| 2009/0014813 A1* | 1/2009 | Chao et al. ............... 257/407 |
| 2009/0022003 A1 | 1/2009 | Song et al. |
| 2009/0026522 A1 | 1/2009 | Anathan |
| 2009/0050948 A1* | 2/2009 | Ishikawa ............... B82Y 25/00 257/295 |
| 2009/0072341 A1 | 3/2009 | Liu et al. |
| 2009/0079030 A1 | 3/2009 | Cheng et al. |
| 2009/0108351 A1 | 4/2009 | Yang et al. |
| 2009/0129145 A1 | 5/2009 | Sleazeck |
| 2009/0140290 A1 | 6/2009 | Schulze et al. |
| 2009/0170261 A1 | 7/2009 | Lee |
| 2009/0173984 A1 | 7/2009 | Wang |
| 2009/0189228 A1 | 7/2009 | Zhang et al. |
| 2009/0200536 A1 | 8/2009 | Van Schaijk et al. |
| 2009/0201723 A1 | 8/2009 | Okhonin et al. |
| 2009/0207681 A1 | 8/2009 | Juengling |
| 2009/0213648 A1 | 8/2009 | Slesazeck |
| 2009/0218656 A1 | 9/2009 | Gonzalez et al. |
| 2009/0242865 A1 | 10/2009 | Lung et al. |
| 2009/0246952 A1 | 10/2009 | Ishizaka et al. |
| 2009/0250738 A1 | 10/2009 | Dyer |
| 2009/0315084 A1 | 12/2009 | Cha et al. |
| 2010/0001271 A1 | 1/2010 | Mieno |
| 2010/0006938 A1 | 1/2010 | Jang |
| 2010/0008139 A1 | 1/2010 | Bae |
| 2010/0044670 A1 | 2/2010 | Ling |
| 2010/0061145 A1 | 3/2010 | Weis |
| 2010/0197141 A1 | 8/2010 | Tu et al. |
| 2010/0200916 A1 | 8/2010 | Gossner et al. |
| 2010/0203695 A1 | 8/2010 | Oh et al. |
| 2010/0207180 A1 | 8/2010 | Lee |
| 2010/0248153 A1 | 9/2010 | Lee et al. |
| 2010/0277982 A1 | 11/2010 | Okhonin |
| 2011/0006377 A1 | 1/2011 | Lee et al. |
| 2011/0024791 A1 | 2/2011 | Schulze et al. |
| 2011/0156044 A1 | 6/2011 | Lee et al. |
| 2011/0163357 A1 | 7/2011 | Tan et al. |
| 2011/0215371 A1 | 9/2011 | Tang et al. |
| 2011/0215396 A1 | 9/2011 | Tang et al. |
| 2011/0215407 A1 | 9/2011 | Tang et al. |
| 2011/0215408 A1 | 9/2011 | Tang et al. |
| 2011/0215436 A1 | 9/2011 | Tang et al. |
| 2011/0223725 A1 | 9/2011 | Kang et al. |
| 2011/0223731 A1 | 9/2011 | Chung et al. |
| 2012/0205736 A1 | 8/2012 | Housely et al. |
| 2012/0223369 A1 | 9/2012 | Gupta et al. |
| 2012/0223380 A1 | 9/2012 | Lee et al. |
| 2014/0008721 A1 | 1/2014 | Filippini et al. |
| 2014/0106554 A1 | 4/2014 | Pozzi et al. |

FOREIGN PATENT DOCUMENTS

| | | |
|---|---|---|
| CN | 201180011630.3 | 7/2014 |
| CN | 201180011589.X | 8/2014 |
| CN | 201180011628.6 | 2/2015 |
| CN | 201180011589.X | 4/2015 |
| EP | 1918998 | 5/2008 |
| EP | 2286206 | 6/2014 |
| EP | 11751053 | 6/2014 |
| JP | H02-275663 | 11/1990 |
| JP | H04-64249 | 2/1992 |
| JP | H04-186815 | 7/1992 |
| JP | H04-283914 | 10/1992 |
| JP | 06-104446 | 4/1994 |
| JP | H08-088153 | 4/1996 |
| JP | H10-150176 | 6/1998 |
| JP | H11-103035 | 4/1999 |
| JP | 2000-150905 | 5/2000 |

(56) References Cited

FOREIGN PATENT DOCUMENTS

| | | |
|---|---|---|
| JP | 2003-030980 | 1/2003 |
| JP | 2004-03398 | 10/2004 |
| JP | 2005-136191 | 5/2005 |
| JP | 2005-327766 | 11/2005 |
| JP | 2007-511895 | 5/2007 |
| JP | 2008-010503 | 1/2008 |
| JP | 2009-531880 | 9/2009 |
| JP | 2011-508979 | 3/2011 |
| KR | 10-0663359 | 10/2006 |
| KR | 10-0702014 | 11/2006 |
| KR | 10-0821456 | 4/2008 |
| KR | 2009-0040460 | 4/2009 |
| KR | 2009-0054254 | 5/2009 |
| KR | 10-2010-0070835 | 6/2010 |
| TW | 200802866 | 1/2008 |
| TW | 101104088 | 12/2013 |
| TW | 100106777 | 2/2014 |
| TW | 100106775 | 6/2014 |
| TW | 1001107759 | 6/2014 |
| WO | WO 2009/088889 | 7/2009 |
| WO | PCT/US2011/024354 | 9/2011 |
| WO | PCT/US2011/024376 | 9/2011 |
| WO | PCT/US2011/024387 | 9/2011 |
| WO | PCT/US2012/021438 | 8/2012 |
| WO | PCT/US2011/024354 | 9/2012 |
| WO | PCT/US2011/024376 | 9/2012 |
| WO | PCT/US2011/024387 | 9/2012 |
| WO | PCT/US2012/025109 | 9/2012 |
| WO | PCT/US2012/025115 | 10/2012 |
| WO | PCT/US2012/021438 | 8/2013 |
| WO | PCT/US2012/025109 | 9/2013 |
| WO | PCT/US2012/025115 | 9/2013 |

OTHER PUBLICATIONS

Nemati et al., A Novel High Density, Low Voltage SRAM Cell with a Vertical NDR Device, IEEE, 1998, 2 pages.
Suliman et al., Gate-Oxide Grown on the Sidewalls and Base of a U-Shaped Si Trench: Effects of the Oxide and Oxide/Si Interface Condition on the Properties of Vertical MOS Devices, Microelectronic Engineering, vol. 72, pp. 247-252, 2004.
Tang et al., Methods, Devices, and Systems Relating to a Memory Cell Having a Floating Body, U.S. Appl. No. 12/410,207, filed Mar. 24, 2009.
Tang, Methods, Devices, and Systems Relating to Memory Cells Having a Floating Body, U.S. Appl. No. 12/419,658, filed Apr. 7, 2009.
Yang et al., High Performance CMOS Fabricated on Hybrid Substrate with Different Crystal Orientations, IEEE, 2003, 4 pages.
Yu et al., Low-Temperature Titanium-Based Wafer Bonding, Journal of the Electrocheical Society, vol. 154, No. 1, 2007, pp. H20-H25.
U.S. Appl. No. 12/715,743, filed Mar. 2, 2010, Tang et al.
U.S. Appl. No. 12/715,889, filed Mar. 2, 2010, Tang et al.
Sasago et al., "Cross-point phase change memory with 4F2 cell size driven by low-contact-resistivity poly-Si diode", Symposium on VLSI Technology Digest of Technical Papers, 2009, pp. 24-25.
Sugizaki et al., "35-nm Gate-Length and Ultra Low-voltage (0.45 V) Operation Bulk Thyristor-SRAM/DRAM (BT-RAM) Cell with Triple Selective Epitaxy Layers (TELs)", Symposium on VLSI Technology Digest of Technical Papers, 2008.
U.S. Appl. No. 12/715,843, filed Mar. 2, 2010, Tang et al.
U.S. Appl. No. 12/715,922, filed Mar. 2, 2010, Tang et al.
Burke et al., "Silicon Carbide Thyristors for Power Applications", Pulsed Power Conference 1995, Digest of Technical Papers, 10th IEEE International vol. 1, United States, pp. 327-335.
Burke et al., "Silicon Carbide Thyristors for PowerApplications", pp. 327-335.
Cheong et al., "Investigation of Ultralow Leakage in MOS Capacitors on4H SiC", IEEE Transactions on Electron Devices, vol. 51(9), Sep. 2004, pp. 1361-1365.
Dimitraiadis et al., "New a-SiC, Optically Controlled, Thyristor-Like Switch", Electronics Letters, vol. 28)17), Aug. 13, 1992, pp. 1622-1624.
Jen et al., "Electrical and Luminescent Characteristics of a-SiC:H P-I-: Thin-Film LED's with Graded-Gap Junctions", IEEE Transactions on Electron Devices, vol. 44(4), Apr. 1997, pp. 565-571.
Powell et al., "SiC Materials-Progress, Status, and Potential Roadblocks", Proceedings of the IEEE, vol. 90(6), Jun. 2002, pp. 942-955.
Xie et al., "A Veritically Integrated Bipolar Storage Cell in 6H Silicon Carbide for Nonvolatile Memory Applications", IEEE Electron Device Letters, vol. 15(6), Jun. 1994, pp. 212-214.
U.S. Appl. No. 14/265,168, filed Apr. 29, 2014, Righetti et al.
"IBM Builds World's Fastest Communications Microchip", Reuters U.S. Company News, Feb. 25, 2002, http://activequote300.fidelity.com/rtrnews/—individual—n . . . / . . . , 1 pg.
Bae, G.J. et al., "A Novel SiGe-Inserted SOI Structure for High Performance PDSOI CMOSFET", IEDM Tech. Digest, 2000, pp. 667-670.
Belford, et al., Performance-Augmented CMOS Using Back-End Uniaxial Strain, DRC Conf. Digest, 2002, pp. 41-42.
Bhattacharyya, A., "The Role of Microelectronic Integration in Environmental Control: A Perspective", Mat. Res. Soc. Symp. Proc. vol. 344, 1994, pp. 281-293.
Cheng, Z. et al., "SiGe-on-Insulator (SGOI): Substrate Preparation and MOSFET Fabrication for Electron Mobility Evaluation" and conference outline, MIT Microsystems, Tech. Labs, Cambridge, MA, 2001 IEEE Internatl. SOI Conf., Oct. 2001, pp. 13-14, 3-pg. outline.
Current, M.I. et al., "Atomic-Layer Cleaving with SixGey Strain Layers for Fabrication of Si and Ge-Rich SOI Device Layers", 2001 IEEE Internatl. SOI Conf. Oct. 2001, pp. 11-12.
Ernst, T. et al., "Fabrication of a Novel Strained SiGe:C-channel Planar 55 nm nMOSFET for High-Performance CMOS", 2002 Sympos. on VLSI Tech. Digest of Technical Papers, pp. 92-93.
Feder, B.J., "I.B.M. Finds Way to Speed Up Chips", The New York Times, Jun. 8, 2001, reprinted from http://www.nytimes.com/2001/06/08/technology/08BLUE.html, 2 pgs.
Garone, P.M. et al., "Mobility Enhancement and Quantum Mechanical Modeling in GexSi1-x Channel MOSFETs from 90 to 300K", IEDM Tech. Digest, 1991, pp. 29-32.
Gu, J. et al., "High Performance Sub-100 nm Si Thin-Film Transistors by Pattern-Controlled Crystallization of Thin Channel Layer and High Temperature Annealing", DRC Conf. Digest 2002, pp. 49-50.
Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209-212.
Hara, A. et al., "High Performance Poly-Si TFTs on a Glass by a Stable Scanning CW Laser Lateral Crystallization", IEDM Tech. Digest, 2001, pp. 747-750.
Huang, L.J. et al., "Carrier Mobility Enhancement in Strained Si-on-Insulator Fabricated by Wafer Bonding", 2001 Sympos. on VLSI Tech. Digest of Technical Papers, pp. 57-58.
Jagar, S. et al., "Single Grain Thin-Fim-Transistor (TFT) with SOI CMOS Performance Formed by Metal-Induced-Lateral-Crystallization", IEDM Tech. Digest, 1999, p. 293-6.
Jeon, J. et al., "A New Poly-Si TFT with Selectively Doped Channel Fabricated by Novel Excimer Laser Annealing", IEDM Tech. Digest, 2000, pp. 213-216.
Kesan, V. et al., "High Performance 0.25 µm p-MOSFETs with Silicon-Germanium Channels for 300K and 77K Operation", IEDM Tech. Digest, 1991, pp. 25-28.
Kim, C.H. et al., "A New High-Performance Poly-Si TFT by Simple Excimer Laser Annealing on Selectivity Floating a-Si Layer", IEDM Tech. Digest, 2001, pp. 751-754.
King, T. et al, "A Low-Temperature (?550° C.) Silicon-Germanium MOS Thin-Film Transistor Technology for Large-Area Electronics", IEDM Tech. Digest, 1991, pp. 567-570.
Kuriyama, H. et al., "High Mobility Poly-Si TFT by a New Excimer Laser Annealing Method for Large Area Electronics", IEDM Tech. Digest, 1991, pp. 563-566.

(56) References Cited

OTHER PUBLICATIONS

Li, P. et al., "Design of High Speed Si/SiGe Heterojunction Complementary MOSFETs with Reduced Short-Channel Effects", Natl. Central University, ChungLi, Taiwan, ROC, Aug. 2001, Contract No. NSC 89-2215-E-008-049, Natl. Science Council of Taiwan., pp. 1, 9.

Lu, N.C.C. et al., "A Buried-Trench DRAM Cell Using a Self-Aligned Epitaxy Over Trench Technology", IEDM Tech. Digest, 1988, pp. 588-591.

Markoff, J., "I.B.M. Circuits are Now Faster and Reduce Use of Power", The New York Times, Feb. 25, 2002, reprinted Mar. 20, 2002, from http://story.news.yahoo.com/ news?tmpl=story&u=/nyt/20020225/ . . . , 1 pg.

Mizuno, T. et al., "High Performance CMOS Operation of Strained-SOI MOSFETs Using Thin Film SiGe-on-Insulator Substrate", 2002 Symposium on VLSI Tech. Digest of Technical Papers, p. 106-107.

Myers, S.M. et al., "Deuterium Interactions in Oxygen-Implanted Copper", J. Appl. Phys., vol. 65(1),. Jan. 1, 1989, pp. 311-321.

Nayfeh, H.M. et al., "Electron Inversion Layer Mobility in Strained-Si n-MOSFET's with High Channel Doping Concentration Achieved by Ion Implantation", DRC Conf. Digest, 2002, pp. 43-44.

Ono, K. et al., "Analysis of Current-Voltage Characteristics in Polysilicon TFTs for LCDs", IEDM Tech. Digest, 1988, pp. 256-259.

Park, et al., "Normal Incident SiGe/Si Multiple Quantum Well Infrared Detector", IEDM Tech. Digest, 1991, pp. 749-752.

Rim, K. et al., "Characteristics and Device Design of Sub-100 nm Strained SiN-and PMOSFETs", 2002 Sympos. on VLSI Tech. Digest of Technical Papers, pp. 98-99.

Rim, K. et al., "Strained Si NMOSFET's for High Performance CMOS Technology", 2001 Sympos. on VLSI Tech. Digest of Technical Papers, pp. 59-60.

Saggio, M. et al., "Innovative Localized Lifetime Control in High-Speed IGBT's", IEEE Elec. Dev. Lett., V. 18, No. 7, Jul. 1997, pp. 333-335.

Shima, M. et al., "<100> Channel Strained-SiGe p-MOSFET with Enhanced Hole Mobility and Lower Parasitic Resistance", 2002 Sympos. on—VLSI Tech. Digest of Technical Papers, pp. 94-95.

Takagi, Strained-Si- and SiGe-on-Insulator (Strained SOI and SGOI) MOSFETs for High Performance/Low Power CMOS Application, DRC Conf. Digest, 2002, pp. 37-40.

Tezuka, T. et al., "High-Performance Strained Si-on-Insulator MOSFETs by Novel Fabrication Processes Utilizing Ge-Condensation Technique", 2002 VLSI Tech. Digest of Technical Papers, pp. 96-97.

Tzeng et al., "Dry Etching of Silicon Materials in SF6 Based Plasmas", J. Electrochem. Soc., 1987 vol. 134, issue 9, pp. 2304-2309.

Van Meer, H. et al., "Ultra-Thin Film Fully-Depleted SOI CMOS with Raised G/S/D Device Architecture for Sub-100 nm Applications", 2001 IEEE Internatl. SOI Conf. Oct. 2001, pp. 45-46.

Yamada, T. et al., "Spread Source/Drain (SSD) MOSFET Using Selective Silicon Growth for 64Mbit DRAMs", IEDM Tech. Digest, 1989, pp. 35-38.

Yamauchi, N. et al., "Drastically Improved Performance in Poly-Si TFTs with Channel Dimensions Comparable to Grain Size", IEDM Tech. Digest, 1989, pp. 353-356.

U.S. Appl. No. 14/461,689, filed Aug. 18, 2014, Mariani et al.
U.S. Appl. No. 14/461,730, filed Aug. 18, 2014, Zanderigo et al.
U.S. Appl. No. 14/461,751, filed Aug. 18, 2014, Mariani et al.
EP 11751050 Supp Search Rept, Nov. 14, 2014, Micron Technology, Inc.
TW 100106776 Search Report, Nov. 25, 2014, Micron Technology, Inc.

* cited by examiner

SEMICONDUCTOR-METAL-ON-INSULATOR STRUCTURES, METHODS OF FORMING SUCH STRUCTURES, AND SEMICONDUCTOR DEVICES INCLUDING SUCH STRUCTURES

CROSS-REFERENCE TO RELATED APPLICATIONS

The present application is related to co-pending U.S. patent application Ser. No. 12/715,843 filed on Mar. 2, 2010, and titled "FLOATING BODY CELL STRUCTURES, DEVICES INCLUDING SAME, AND METHODS FOR FORMING SAME"; co-pending U.S. patent application Ser. No. 12/715,743 filed on Mar. 2, 2010, and titled "SEMICONDUCTOR DEVICES INCLUDING A DIODE STRUCTURE OVER A CONDUCTIVE STRAP AND METHODS OF FORMING SUCH SEMICONDUCTOR DEVICES"; co-pending U.S. patent application Ser. No. 12/715,889 filed on even date herewith Mar. 2, 2010, and titled "THYRISTOR-BASED MEMORY CELLS, DEVICES AND SYSTEMS INCLUDING THE SAME AND METHODS FOR FORMING THE SAME"; and co-pending U.S. patent application Ser. No. 12/715,922 filed on Mar. 2, 2010, and titled "SEMICONDUCTOR CELLS, ARRAYS, DEVICES AND SYSTEMS HAVING A BURIED CONDUCTIVE LINE AND METHODS FOR FORMING THE SAME", the disclosures of which are incorporated herein by reference.

TECHNICAL FIELD

The present invention, in various embodiments, relates generally to semiconductor structures including a buried conductive material, and methods of forming such semiconductor structures. More specifically, embodiments of the present invention relate to a semiconductor-metal-on-insulator (SMOI) structure having a buried conductive material and methods of forming such structure. Additionally, the present invention relates to semiconductor devices including such SMOI structures and methods of forming such semiconductor devices.

BACKGROUND

One of the common trends in the electronics industry is the miniaturization of electronic devices. This is especially true for electronic devices operated through the use of semiconductor microchips. Microchips are commonly viewed as the brains of most electronic devices. In general, a microchip comprises a small silicon wafer upon which can be built millions or billions of nanoscopic electronic devices that are integrally configured to form electronic circuits. The circuits are interconnected in a unique way to perform a desired function.

With the desire to make high density microchips, it is necessary to decrease the size of the individual electronic devices and interconnects thereon. This movement also known as the so called "scale down" movement has increased the number and complexity of circuits on a single microchip.

Conventionally, electronic devices are formed side-by-side in a single plane on a common substrate, such as a silicon wafer. This side-by-side positioning, however, uses a relatively large amount of surface area, or "real estate," on the substrate. As a result, devices may be formed vertically in an effort to utilize less substrate area. In order to be competitive, such vertical devices are formed with high aspect ratios (i.e., the ratio of height to widths). However, as the aspect ratio of a device increases, it becomes increasingly difficult to satisfy both territory and electronic requirements of the corresponding interconnects. For this reason, simpler planar device scale downs dominate the industry in real practice to date.

A recent trend is to vertically stack semiconductor devices on a substrate. However, the stacking of semiconductor devices adds an additional complexity to connecting the components of the semiconductor device as well as providing efficient interconnects between the stacks.

Accordingly, there is a need for a method of forming a vertical semiconductor device which provides for competitive accessibility of interconnects to an electronic device in a stacked semiconductor device.

DETAILED DESCRIPTION

Figure 1:
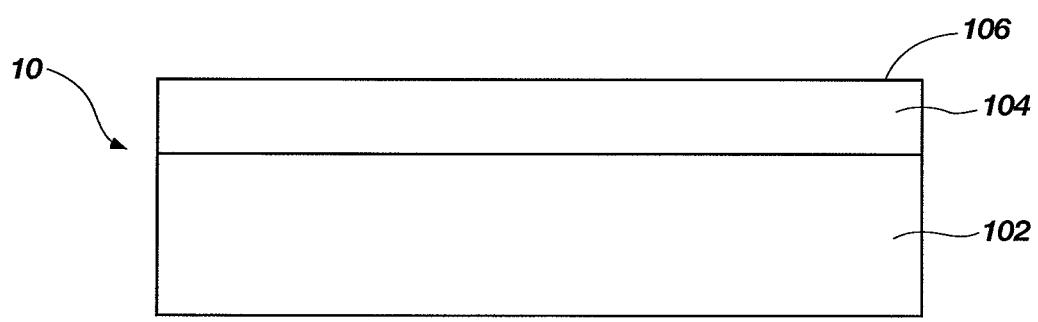
FIGS. 1-6 are cross-sectional views of an SMOI structure during various processing acts in accordance with one embodiment of the disclosure.

A semiconductor-metal-on-insulator (SMOI) structure and methods of forming such an SMOI structure. Such structures include, in one embodiment, an insulator material on a first semiconductor substrate, an amorphous silicon material bonded to the insulator material, a conductive material over the amorphous silicon material, and a second semiconductor substrate over the conductive material. Methods of forming such structures include, in one embodiment, forming an acceptor wafer including an insulator material formed over a first semiconductor substrate, forming a donor wafer including forming a conductive material over a precursor semiconductor substrate, forming an amorphous silicon material over the conductive material, and implanting ions into the precursor semiconductor substrate at a depth to form an implanted zone. The amorphous silicon material of the donor wafer may be bonded to the insulator material of the acceptor wafer. A portion of the precursor semiconductor substrate above the implanted zone may then be removed.

The SMOI structures formed in accordance with the various embodiments of the disclosure include an amorphous silicon material bonded to an insulator material, a conductive material, or an additional amorphous silicon material. The amorphous silicon material exothermically crystallizes or reacts with the insulator material, the conductive material, or the additional amorphous silicon material, which allows for silicon atom rearrangement, which can improve the bond strength at the interface between the amorphous silicon material and the insulator material, the conductive material, or the additional silicon material. As such, the bond created between the amorphous silicon material and the at least one of the insulator material, the conductive material, and the additional amorphous silicon material may be substantially stronger than a bond created between two insulator materials, such as two oxide materials. Additionally, the bonding of the amorphous silicon material to the insulator material may occur at a relatively low temperature, such as at room temperature (from approximately 20° C. to approximately 25° C.), and, thus, reduces the risk of damage to any underlying devices formed on the first semiconductor substrate. Bonding of the amorphous silicon material to the at least one of the insulator material, the conductive material, and the additional amorphous silicon material is described in greater detail below. The SMOI structures formed in accordance with the various embodiments of the disclosure may also include a conductive material disposed between the insulator material and the second semiconductor substrate. The conductive material is buried beneath the second semiconductor substrate. The conductive material may be used, in some embodiments, to form an interconnect, such as a word line or a bit line, or to form a metal strap. Such an interconnect may be used to facilitate access to a semiconductor device formed in the second semiconductor substrate.

The SMOI structures formed in accordance with various embodiments of the disclosure may be used to fabricate a variety of semiconductor devices, such as an integrated circuit including a logic device formed in/on the first semiconductor substrate and a memory device formed in/on the second semiconductor substrate. Since the conductive material is buried beneath the second semiconductor substrate, devices formed on the second semiconductor substrate may be formed in relatively few process acts, as described in greater detail below. Additionally, the devices formed on/in the second semiconductor substrate may be self-aligned with the underlying interconnect and/or source and drain contacts, thus eliminating the need for a separate electrical contact. Furthermore, since a logic device may be formed on the first semiconductor substrate before the SMOI structure and the memory device are formed, the memory device is not exposed to the processing conditions used for the formation of the logic device. By forming such vertical, self-aligned, stacked integrated circuits, the cell size may be reduced, which provides for increased cache memory density.

The following description provides specific details, such as material types and processing conditions, in order to provide a thorough description of embodiments of the disclosure. However, a person of ordinary skill in the art will understand that embodiments of the present invention may be practiced without employing these specific details and in conjunction with conventional fabrication techniques. In addition, the description provided herein does not form a complete process flow for manufacturing a semiconductor device including the SMOI structure. Only those process acts and structures necessary to understand the embodiments of the disclosure are described in detail below. Additional acts to form a complete semiconductor device including the SMOI structure according to an embodiment of the invention may be performed by conventional techniques. In addition, it is understood that the methods described herein may be repeated as many times as desired to form multiple, stacked SMOI structures.

The materials described herein may be formed by any suitable technique including, but not limited to, spin coating, blanket coating, chemical vapor deposition ("CVD"), plasma enhanced chemical vapor deposition ("PECVD"), atomic layer deposition ("ALD"), plasma enhanced ALD, or physical vapor deposition ("PVD"). Alternatively, materials may be grown in situ. A technique suitable for depositing or growing a particular material may be selected by a person of ordinary skill in the art. While the materials described and illustrated herein may be formed as layers, the materials are not limited thereto and may be formed in other three-dimensional configurations.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular system, logic device, memory cell, or semiconductor device, but are merely idealized representations which are employed to describe embodiments of the disclosure. The drawings presented herein are not necessarily drawn to scale. Additionally, elements common between drawings may retain the same numerical designation.

Figure 2:
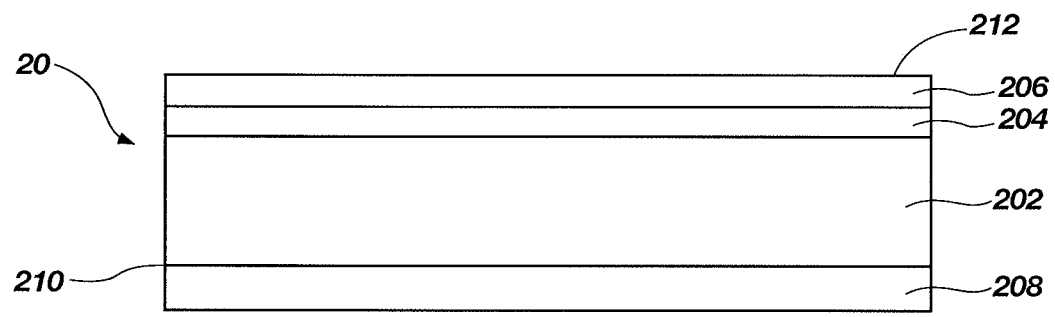

Referring now to the drawings, where like elements are designated by like reference numerals, FIGS. 1 through 6 are partial cross-sectional views of a method of forming an embodiment of an SMOI structure 30 (FIG. 6) including a conductive material 204, which is buried. The SMOI structure 30 is formed by bonding an acceptor wafer 10 (FIG. 1) and a donor wafer 20 (FIG. 2). FIG. 1 depicts the acceptor wafer 10. The acceptor wafer 10 may include a first semiconductor substrate 102 having an insulator material 104 formed thereon. The first semiconductor substrate 102 may include a fabrication substrate, such as a full or partial wafer of semiconductor material (e.g., silicon, gallium arsenide, indium phosphide, etc.), a full or partial silicon-metal-on-insulator (SMOI) type substrate, such as a silicon-on-glass (SOG), silicon-on-ceramic (SOC), or silicon-on-sapphire (SOS) substrate, or any other known, suitable fabrication substrate. As used herein, the term "wafer" includes conventional wafers as well as other bulk semiconductor substrates. The first semiconductor substrate 102 may be doped or undoped. An at least partially fabricated logic device (not shown), such as a CMOS device, may optionally be present on the first semiconductor substrate 102 and may be formed by conventional techniques. In one embodiment, the first semiconductor substrate 102 is bulk crystalline silicon.

The insulator material 104 may be a dielectric material including, by way of non-limiting example, silicon dioxide, borophosphosilicate glass (BPSG), borosilicate glass (BSG), phosphosilicate glass (PSG) or the like. In one embodiment, the insulator material 104 is a buried oxide. The insulator material 104 may be from about 500 Å to about 2 µm thick, such as from about 1000 Å to about 2000 Å. Techniques for deposition and in situ growth of such dielectric materials are known in the art and may include, for example, chemical vapor deposition (CVD), such as low pressure CVD or plasma enhanced CVD, atomic layer deposition (ALD), spin-on deposition, thermal decomposition, or thermal growth. The insulator material 104 includes an upper surface 106.

Figure 6:
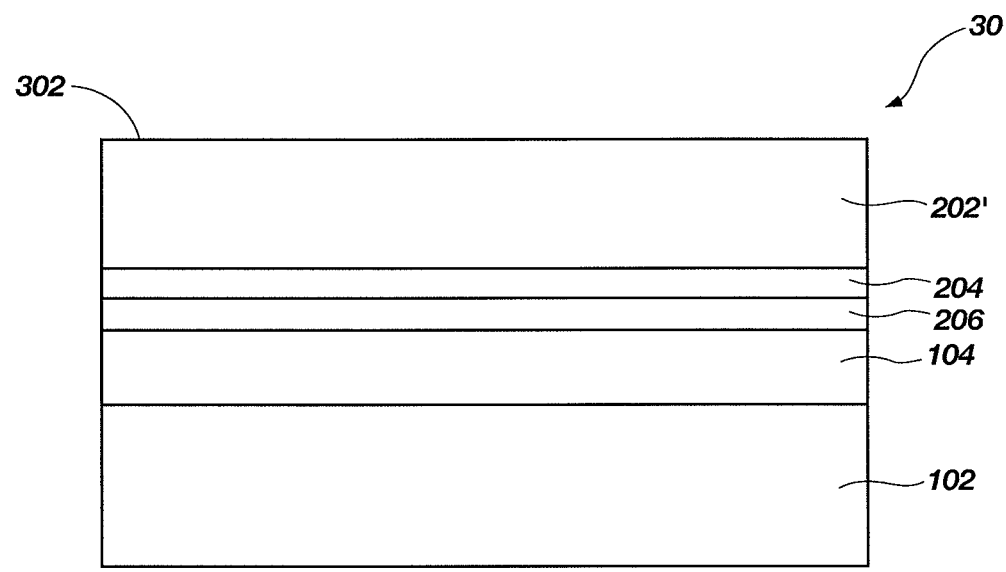

FIG. 2 is a partial cross-sectional view of one embodiment of the donor wafer 20 used to form the SMOI structure 30 (FIG. 6). The donor wafer 20 may include a precursor semiconductor substrate 202 having a conductive material 204 and an amorphous silicon material 206 formed thereon. In some embodiments, a polysilicon material or another amorphous material, such as amorphous germanium, may be substituted for the amorphous silicon material 206. The precursor semiconductor substrate 202 may be, for example, one of the fabrication substrates mentioned above for use as first semiconductor substrate 102. In one embodiment, the precursor semiconductor substrate 202 is a silicon substrate, such as a crystalline silicon substrate. The precursor semiconductor substrate 202 may be doped or undoped. The conductive material 204 may be a low resistivity material including, but not limited to, a phase change material, titanium, titanium silicide, titanium oxide, titanium nitride, tantalum, tantalum silicide, tantalum oxide, tantalum nitride, tungsten, tungsten silicide, tungsten oxide, tungsten nitride, other metal, metal silicide, metal oxide, or metal nitride materials, or combinations thereof, including multiple, different conductive materials. In one embodiment, the conductive material 204 may be formed from titanium nitride because titanium nitride has good adherence or adhesion to many materials, such as the material used as the precursor semiconductor substrate 202. Titanium nitride also has a high melting point (about 3000° C.), which makes it unaffected by high processing temperatures. Titanium nitride also makes excellent ohmic contact with other conductive materials. Titanium nitride is also commonly used in semiconductor fabrication and, therefore, may easily be incorporated into conventional fabrication processes. In one embodiment, the conductive material 204 is a titanium-rich titanium nitride, such as metal mode titanium nitride (MMTiN). The conductive material 204 may also be formed from multiple conductive materials. In one embodiment, the conductive material 204 is a MMTiN material over the precursor semiconductor substrate 202 and a tungsten silicide material over the MMTiN material. In another embodiment, the conductive material 204 may be formed from a metal, such as titanium, tungsten or aluminum, with a layer of titanium material formed thereon. The thickness of the conductive material 204 may be optimized, depending on the material, to provide a low ohmic contact between the conductive material 204 and the precursor semiconductor substrate 202. For example, if the conductive material 204 is titanium nitride, such as MMTiN, the conductive material 204 may have a thickness of from about 10 nm to about 50 nm. The conductive material 204 may be formed by a deposition technique known in the art, such as, for example, atomic layer deposition (ALD), chemical vapor deposition (CVD), or plasma vapor deposition (PVD).

The amorphous silicon material 206 may be formed over the conductive material 204 by a deposition technique known in the art, such as, for example, ALD, CVD, or PVD. In one embodiment, the amorphous silicon material 206 may be formed on the conductive material 204 by PVD, followed by chemical mechanical planarization (CMP). The amorphous silicon material 206 may be of sufficient thickness to adhere to the insulator material 104 of the acceptor wafer 10 as described in greater detail below. For example, the thickness of the amorphous silicon material 206 may be from about 10 nm to about 50 nm. The amorphous silicon material 206 includes a surface 212.

As depicted in FIG. 2, the donor wafer 20 may also include a cleave portion 208 formed by implanting an atomic species into the precursor semiconductor substrate 202. The atomic species may be hydrogen ions, ions of rare gases, also termed inert or noble gases, or ions of fluorine. The atomic species may be implanted into the precursor semiconductor substrate 202 of the donor wafer 20 to form an implanted zone 210. The atomic species may be implanted into the precursor semiconductor substrate 202 prior to formation of the conductive material 204 thereon, after formation of the conductive material 204 thereon, or after formation of the amorphous silicon material 206 thereon. The implanted zone 210 may be formed at a desired depth in the precursor semiconductor substrate 202, which is dependent on parameters, such as implant dose and energy of the atomic species, as known in the art. The depth of the implanted zone 210 may correspond to the thickness of a second semiconductor substrate 202' of the SMOI structure 30 (FIG. 6). The implanted zone 210 may include microbubbles or microcavities including the implanted atomic species, which provide a weakened region within the precursor semiconductor substrate 202. The donor wafer 20 may be thermally treated at a temperature above that at which implantation is effected, but below the melting temperature of the conductive material 204, to effect crystalline rearrangement in the donor wafer 20 and coalescence of the microbubbles or microcavities. As described below, the donor wafer 20 may be cleaved at the implanted zone 210, forming the second semiconductor substrate 202' on the SMOI structure 30 (FIG. 6) and cleave portion 208. For clarity, the term "second semiconductor substrate" is used herein to refer to the semiconductor structure after removal of the cleave portion 208, while the term "precursor semiconductor substrate" is used herein to refer to the semiconductor structure before removal of the cleave portion 208.

Figure 3:
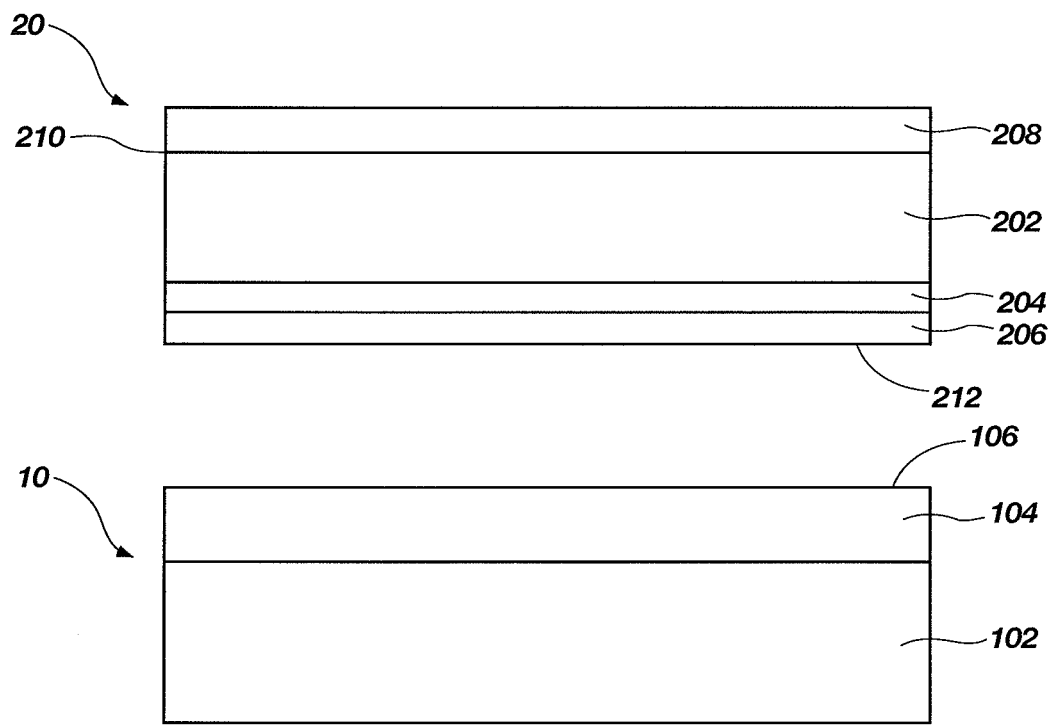
Figure 4:
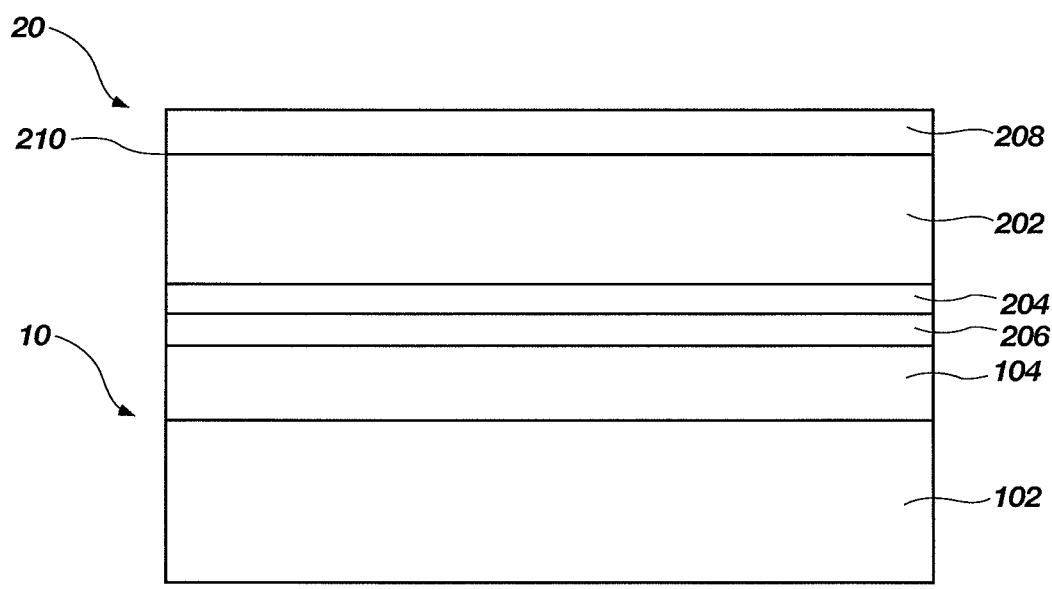

As shown in FIGS. 3 and 4, the donor wafer 20 may be superposed onto the acceptor wafer 10 such that the amorphous silicon material 206 of the donor wafer 20 is in contact with the insulator material 104 of the acceptor wafer 10 (FIG. 4). The amorphous silicon material 206 of the donor wafer 20 may then be bonded to the insulator material 104 of the acceptor wafer 10 by exposure to heat. Prior to bonding the donor wafer 20 to the acceptor wafer 10, at least one of the surface 212 of the amorphous silicon material 206 and the upper surface 106 of the insulator material 104 may, optionally, be treated to improve the bond strength between the amorphous silicon material 206 and the insulator material 104. Such treatment techniques are known in the art and may include chemical, plasma, or implant activations. For example, the upper surface 106 of the insulator material 104 may be treated with a dilute ammonia hydroxide or hydrogen fluoride solution. The surface 212 of the amorphous silicon material 206 may also be exposed to a plasma of, for example, argon, to form a plasma-activated surface. Activating at least one of the surface 212 of the amorphous silicon material 206 and the upper surface 106 of the insulator material 104 may increase the kinetics of the subsequent bonding therebetween due to an increased mobility of ionic species (for example, hydrogen) created on the surface 212 of the amorphous silicon material 205 and the upper surface 106 of the insulator material 104.

As shown in FIG. 4, the amorphous silicon material 206 of the donor wafer 20 may be contacted and bonded with the insulator material 104 of the acceptor wafer 10 to form a precursor of the SMOI structure 30. The amorphous silicon material 206 may be bonded to the insulator material 104 by, for example, heating the SMOI structure 30 to a temperature of less than about 600° C., such as from about 300° C. to about 400° C. If the insulator material 104 is formed from silicon dioxide, silicon-oxide bonds may form between the amorphous silicon material 206 and the insulator material 104. Because the conductive material 204 may be formed of a metal or other heat sensitive material, the temperature to which the SMOI structure 30 is exposed may be less than the melting point of the conductive material 204. The amorphous silicon material 206 and the insulator material 104 may also be bonded without heat, such as at ambient temperature (from about 20° C. to about 25° C.). Pressure may also be applied to the donor wafer 20 and the acceptor wafer 10 to bond the amorphous silicon material 206 to the insulator material 104. Once the donor wafer 20 is bonded to the acceptor wafer 10, the conductive material 204 from the donor wafer 20 may form a buried conductive material, which is disposed between the insulator material 104 and the precursor semiconductor substrate 202.

Figure 5:
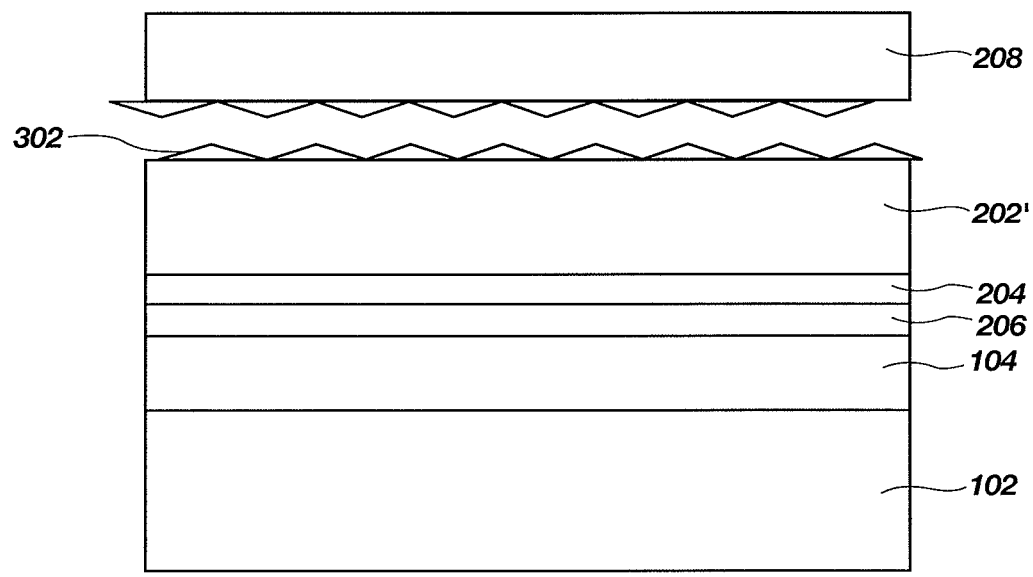

To form the SMOI structure 30 (FIG. 6), the cleave portion 208 may be removed from the precursor semiconductor substrate 202, as shown in FIG. 5. The cleave portion 208 may be removed by techniques known in the art, such as by applying a shear force to the implanted zone 210 or by applying heat or a jet gas stream at the implanted zone 210. The hydrogen or other ions implanted in the implanted zone 210 produce a weakened region in the precursor semiconductor substrate 202, which is susceptible to cleavage. The remaining portion of the second semiconductor substrate 202' may have a thickness, for example, of from about 50 nm to about 500 nm (from about 500 Å to about 5000 Å). A surface 302 of the SMOI structure 30, exposed after removing the cleave portion 208, may be rough and jagged. The exposed surface 302 of the SMOI structure 30 may be smoothed to a desired degree in order to facilitate further processing of the SMOI structure 30, as described below. The exposed surface 302 of the SMOI structure may be smoothed according to conventional techniques such as, for example, one or more of grinding, wet etching, chemical-mechanical polishing (CMP), and planar reactive ion etching (RIE).

The SMOI structure 30 and the other structures described below may be formed by modification of SMART-CUT® layer transfer technology. The SMART-CUT® layer transfer technology is described in detail in, for example, U.S. Pat. No. RE 39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., U.S. Pat. No. 6,946,365 to Aspar et al., and U.S. Patent Application Publication No. 2006/0099776 to Dupont. However, other processes suitable for manufacturing an SMOI substrate may also be used, if sufficiently low process temperatures are maintained. In conventional implementation of the SMART-CUT® layer transfer technology, donor wafers and acceptor wafers are bonded together using a high temperature anneal. The temperature used to bond the donor and acceptor wafers is from about 1000° C. to about 1300° C. However, due to the presence of the conductive material 204 in the SMOI structures described herein, the SMOI structures of the disclosure may, in some circumstances, be unable to withstand exposure to such temperatures without thermal damage. Accordingly, as described above, lower temperatures may be used to bond and acceptor wafer 10 and donor wafer 20.

FIG. 6 is an illustration of the SMOI structure 30 after the exposed surface 302 has been smoothed. Once the donor wafer 20 is bonded to the acceptor wafer 10 and the exposed surface 302 smoothed, then a semiconductor device, such as a memory cell, may be formed on and/or within the second semiconductor substrate 202' of the SMOI structure 30. As described below, the conductive material 204 of the SMOI structure 30 may function as, for example, an interconnect, such as a bit line or word line, as a gate, or as a metal strap.

Figure 7:
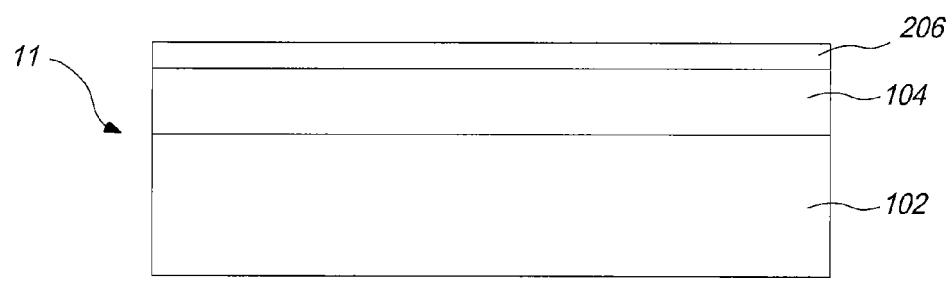
FIGS. 7-10 are cross-sectional views of an SMOI structure during various processing acts in accordance with another embodiment of the disclosure.
Figure 8:
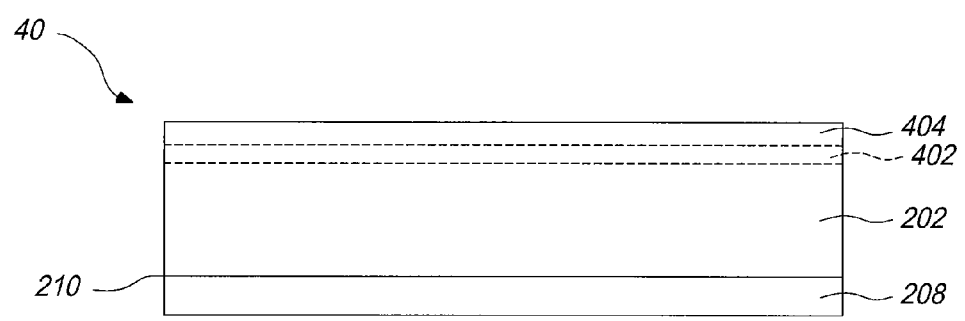
Figure 9:
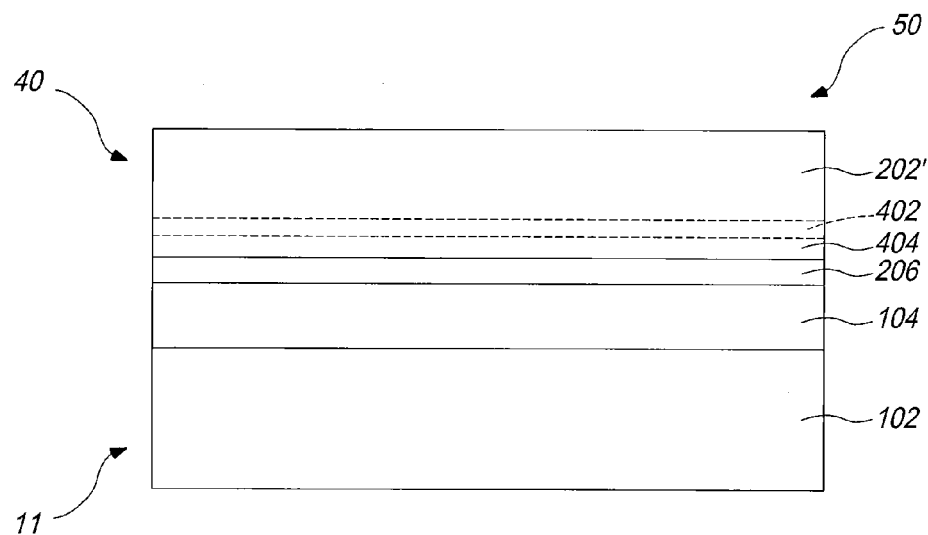
Figure 10:
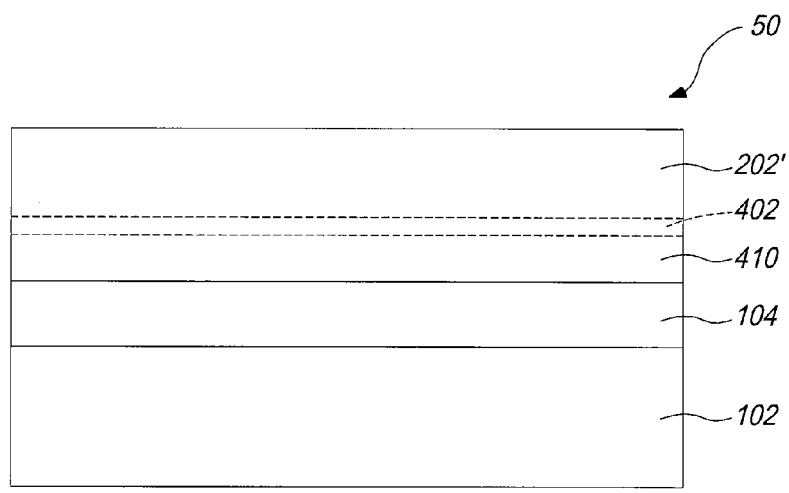

FIGS. 7 through 10 are partial cross-sectional views of a method of forming an embodiment of an SMOI structure 50 (FIG. 10) including a conductive silicide material 410, which is buried. FIG. 7 illustrates an acceptor wafer 11 used to form the SMOI structure 50 (FIG. 10). The acceptor wafer 11 may be substantially similar to the acceptor wafer 10 described above and may be formed as described above regarding FIG. 1, with the exception that the amorphous silicon material 206 may be formed over the insulator material on the acceptor wafer 10. As shown in FIG. 7, the acceptor wafer 11 may include the amorphous silicon material 206 formed over the insulator material 104 and the insulator material 104 formed over the first semiconductor substrate 102.

FIG. 8 is a partial cross-sectional view of one embodiment of a donor wafer 40 used to form the SMOI structure 50 (FIG. 10). The donor wafer 40 may be substantially similar to the donor wafer 20 described above and may be formed as described above regarding FIG. 2, with the exception that the donor wafer 40 may include an optional non-reactive conductive material 402 and a reactive conductive material 404 instead of conductive material 204 (FIG. 2), and the amorphous silicon material 206 (FIG. 2) is not formed on the donor wafer 40. The non-reactive conductive material 402 may be formed of, for example, a metal nitride, such as titanium nitride. However, any conductive material that will not chemically react with the reactive conductive material 404 or a reaction product thereof may be used. The thickness of the non-reactive conductive material 402 may be relatively thin compared to the thickness of the reactive conductive material 404. For example, the non-reactive conductive material 402 may have a thickness of from about 20 Å to about 200 Å. The reactive conductive material 404 may be formed of a metal capable of reacting with the amorphous silicon material 206 or acts as a catalyst for crystallizing the amorphous silicon material 206. In one embodiment, the reactive conductive material 404 is titanium. The reactive conductive material 404 may have a thickness of from about 200 Å to about 500 Å. The non-reactive conductive material 402 and the reactive conductive material 404 may be formed by a deposition technique known in the art, such as, for example, ALD, CVD, or PVD.

As shown in FIG. 9, the donor wafer 40 may be superposed onto the acceptor wafer 11 and bonded thereto and the cleave portion 208 (FIG. 8) removed, as previously described regarding FIGS. 3-6. The resulting SMOI structure 50 may include the first semiconductor substrate 102, the insulator material 104, the amorphous silicon material 206, the reactive conductive material 404, the non-reactive conductive material 402, and the second semiconductor substrate 202'.

As shown in FIG. 10, the SMOI structure 50 may be annealed so that the reactive conductive material 404 chemically reacts with the amorphous silicon material 206, forming the conductive silicide material 410, which is buried beneath the non-reactive conductive material 402. The reactive conductive material 404 may be formed from titanium, which reacts with the amorphous silicon material 206 to form titanium silicide as the conductive silicide material 410. The reactive conductive material 404 and the non-reactive conductive material 402 may also be a single material, such as titanium-rich titanium nitride (MMTi). Excess titanium in the titanium-rich titanium nitride may react with the amorphous silicon material 206, forming the conductive silicide material 410. Annealing the SMOI structure 50 to form the conductive silicide material 410 may occur at a temperature of, for example, from about 600° C. to about 800° C. The bond strength between the conductive silicide material 410 and the insulator material 104 may be greater than that between the amorphous silicon material 206 and the insulator material 104. The conductive silicide material 410 may provide a lower resistance to the SMOI structure 50 than the reactive conductive material 404.

Figure 11:
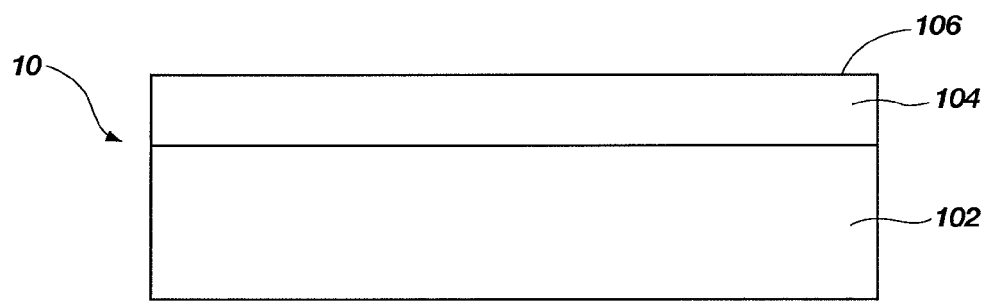
FIGS. 11-14 are cross-sectional views of an SMOI structure during various processing acts in accordance with another embodiment of the disclosure.

FIGS. 11 through 14 are partial cross-sectional views of a method of forming an embodiment of an SMOI structure 70 (FIG. 14) including a conductive material, which is buried beneath a doped semiconductor substrate. FIG. 11 illustrates an acceptor wafer 10, which is a substantial duplication of FIG. 1 and may be formed as described above regarding FIG. 1. As shown in FIG. 11, the acceptor wafer may include the insulator material 104 formed over the first semiconductor substrate 102.

Figure 12:
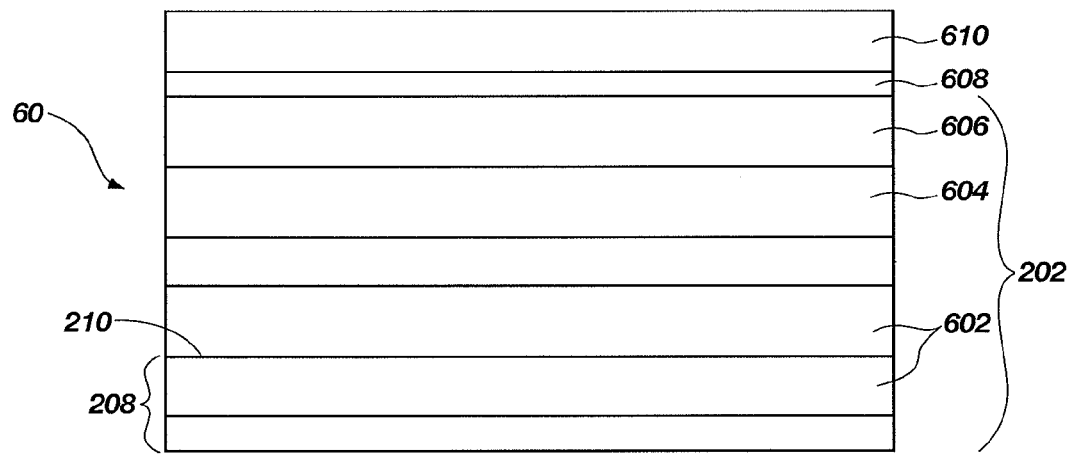
Figure 13:
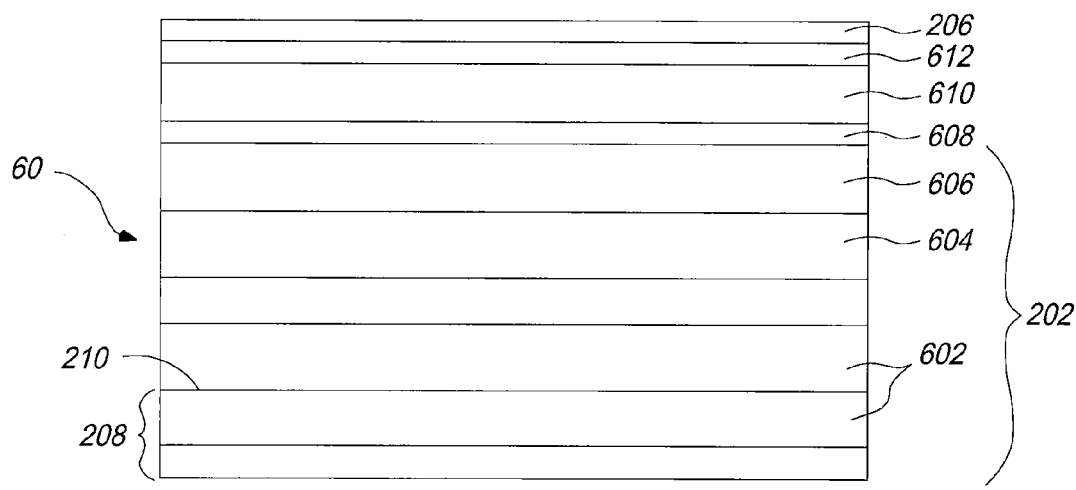
Figure 14:
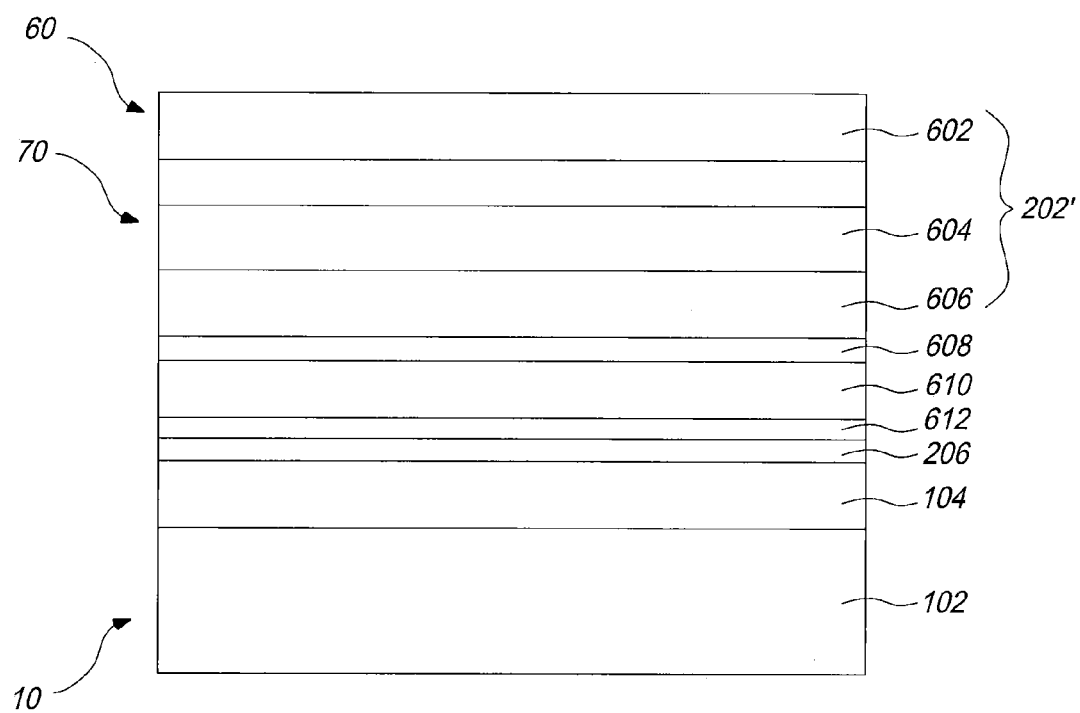

FIG. 12 is a partial cross-sectional view of one embodiment of a donor wafer 60 used to form the SMOI structure 70 (FIG. 14). The donor wafer 60 may include a precursor semiconductive substrate 202 similar to the donor wafer 20 described above and may be formed as described above regarding FIG. 2. The precursor semiconductive substrate 202 may be doped and activated, as known in the art, to form a P+ doped region 602, an N− doped region 604, and an N+ doped region 606. In one embodiment, the precursor semiconductive substrate 202 may be doped using a high temperature process since when the precursor semiconductive substrate does not yet include a MMTiN material 610 (FIG. 13) which may be damaged by such high temperature processes. In another embodiment, the P+ doped region 602 may be formed after the SMOI device 70 (FIG. 14) has been formed using a low temperature process for better dopant profile control. While FIG. 12 is depicted as including a particular order of the P+ doped region 602, the N− doped region 604, and the N+ doped region 606, it is understood that one of ordinary skill in the art may choose any combination of doped regions to achieve desired functions for the SMOI structure 70 (FIG. 14). Because the donor wafer 60 has two exposed surfaces from which the desired dopant may be implanted, the depth and concentration (i.e. highly doped or lightly doped) of the doped regions 602, 604, 606 may be more easily and accurately controlled than if the doped regions were formed after the donor wafer 60 is bonded to the acceptor wafer 10. As shown in FIG. 12, a silicide material 608 may be formed over the precursor semiconductor substrate 202, such as over the N+ doped region 606. The silicide material 608 may be formed by forming reactive conductive material over the precursor semiconductor substrate 202 so that the reactive conductive material reacts with the precursor semiconductor substrate 202 to form the silicide material 608. The silicide material 608 may have a low ohmic contact with the precursor semiconductor substrate 202. A metal mode titanium nitride (MMTiN) material may be formed over the silicide material 608. MMTiN material 610 and tungsten silicide material 612 may be formed by a deposition technique known in the art, such as, for example, ALD, CVD, or PVD. The thickness of the silicide material 608 may be relatively thin compared to the thickness of the MMTiN material 610. For example, the silicide material 608 may have a thickness of from about 50 Å to about 500 Å. The MMTiN material 610 may have a thickness of from about 500 Å to about 1000 Å. Also, as depicted in FIG. 12, the cleave portion 208 may be formed by implanting an atomic species into the precursor semiconductor substrate 202, forming the implanted zone 210 as previously described regarding FIG. 2. As shown in FIG. 12, the implanted zone 210 may be formed within the P+ doped region 602 of the precursor semiconductor substrate 202. The silicide material 608 and the MMTiN material 610 may have a substantially minimal impact on the implanting of the atomic species when forming the implanted zone 210

As shown in FIG. 13, a tungsten silicide material 612 and an amorphous silicon material 206 may be formed over the silicide material 608. The tungsten silicide material 612 may be formed by a deposition technique known in the art, such as, for example, ALD, CVD, or PVD. The tungsten silicide material 612 may be a better conductor than the MMTiN nitride material 610. In some embodiments, the tungsten silicide material 612 may be formed over the titanium silicide material 612 and MMTiN material 610 after the implanted zone 210 is formed.

As shown in FIG. 14, the donor wafer 60 may be superposed onto the acceptor wafer 10 and bonded thereto and the cleave portion 208 (FIG. 13) removed, as previously described regarding FIGS. 3-6. The resulting SMOI structure 70 may include the first semiconductor substrate 102, the insulator material 104, the amorphous silicon material 206, the tungsten silicide material 612, the MMTiN material 610, the silicide material 608, and the second semiconductor substrate 202' including the N+ doped region 606, the N− doped region 604, and the P+ doped region 602. In some embodiments, a second conductive material (not shown) may be formed over the P+ doped region 602 to form a top electrode which may be used to form a semiconductor device as described in greater detail below.

Figure 15:
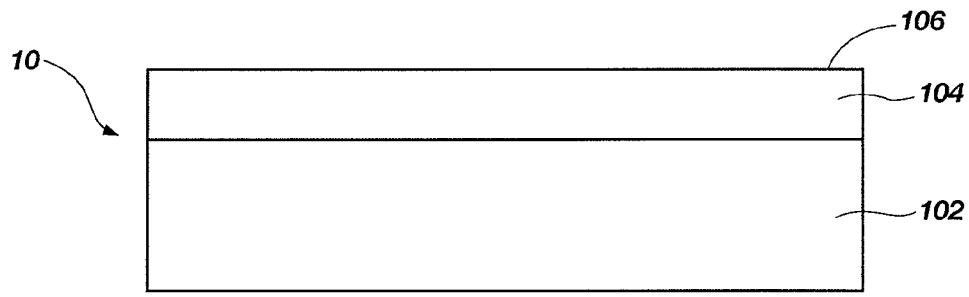
FIGS. 15-18 are cross-sectional views of an SMOI structure during various processing acts in accordance with another embodiment of the disclosure.

FIGS. 15 through 18 are partial cross-sectional views of another method of forming an embodiment of an SMOI structure 90 (FIG. 18) including a doped semiconductor material. FIG. 15 is a substantial duplication of FIG. 1 and may be formed as described above regarding FIG. 1. As shown in FIG. 15, the acceptor wafer 10 includes the insulator material 104 formed over the first semiconductor substrate 102.

Figure 16:
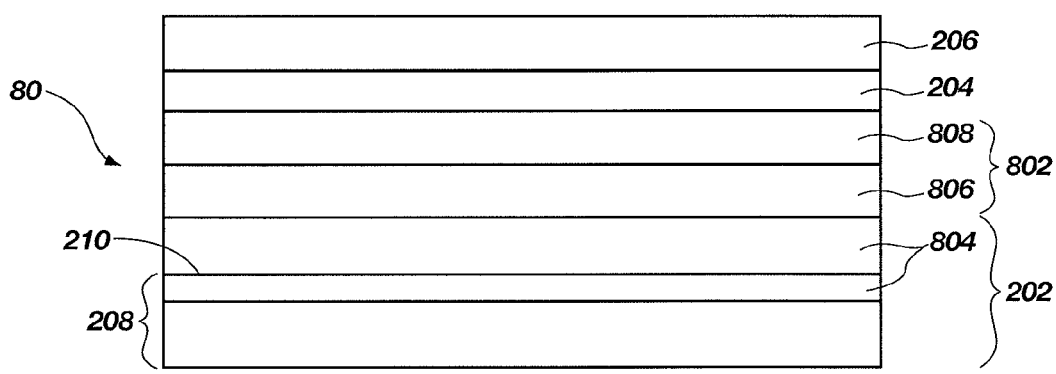
Figure 18:
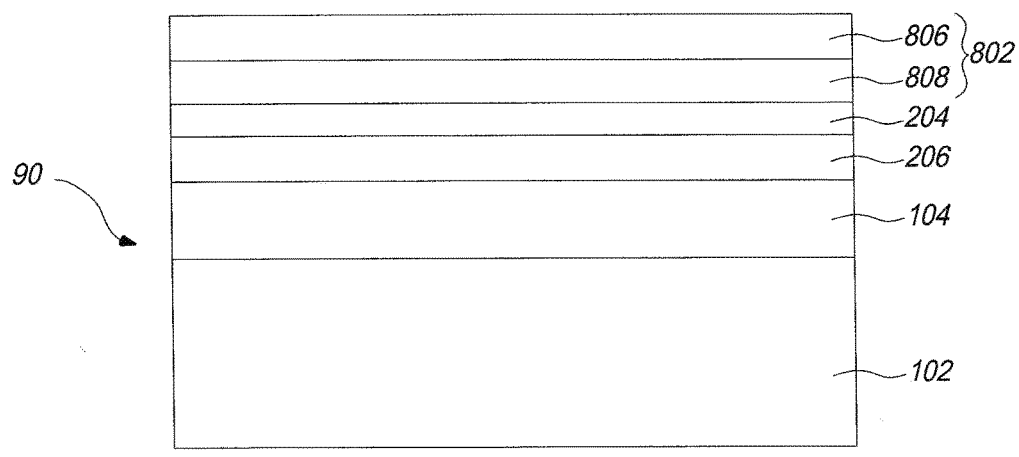

FIG. 16 is a partial cross-sectional view of one embodiment of a donor wafer 80 used to form the SMOI structure 90 (FIG. 18). The donor wafer 80 may be substantially similar to the donor wafer 20 described regarding FIG. 2 above and may be formed as described above regarding FIG. 2, with the exception that the donor wafer 80 may include a doped semiconductive material 802 disposed between the precursor semiconductor substrate 202 and the conductive material 204. The doped semiconductive material 802 may be formed of, for example, at least one of germanium (Ge), silicon carbide (SiC) and gallium nitride (GaN). The precursor semiconductor substrate 202 may be doped to form at least one P+ or N+ doped region 804. The doped semiconductive material 802 may also be doped to form a P doped region 806 and an N doped region 808. In one example, the P doped region 806 may include a P doped silicon carbide material adjacent the P+ or N+ doped region 804 of the precursor semiconductor substrate 202 and the N− doped region 808 may include an N doped silicon carbide material adjacent the P doped region 806. The doped semiconductive material 802 may be formed on the precursor semiconductor substrate 202 using conventional deposition or in situ growth techniques and may include, for example, chemical vapor deposition (CVD), such as low pressure CVD or plasma enhanced CVD, atomic layer deposition (ALD), spin-on deposition, thermal decomposition, or thermal growth. The conductive material 204 and the amorphous silicon material 206 may be deposited over the doped semiconductive material 802, and the precursor semiconductor substrate 202 may be implanted with an atomic species to form the implanted zone 210 and the cleave portion 208 as described above regarding FIG. 2.

Figure 17:
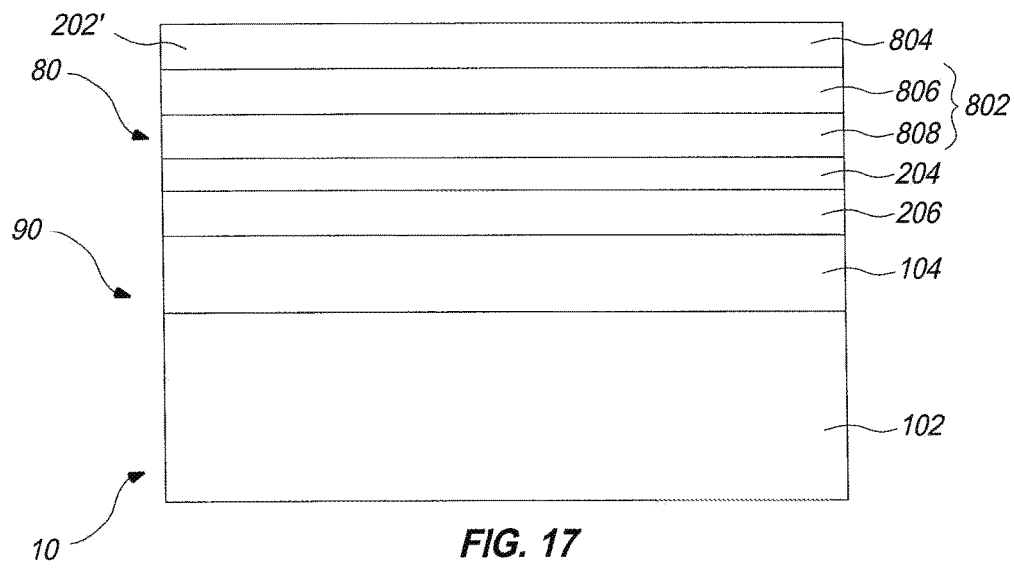

As shown in FIG. 17, the donor wafer 80 may be superposed onto the acceptor wafer 10 and bonded thereto and the cleave portion 208 removed as previously described regarding FIGS. 3-6. The resulting SMOI structure 90 includes the first semiconductor substrate 102, the insulator material 104, the amorphous silicon material 206, the conductive material 204, the doped semiconductive material 802 including the N doped region 808 and the P doped region 806, and the second semiconductor substrate 202' including the P+ or N+ doped region 804. As shown in FIG. 18, the second semiconductor substrate 202' may be polished using techniques known in the art, such as CMP.

Figure 19:
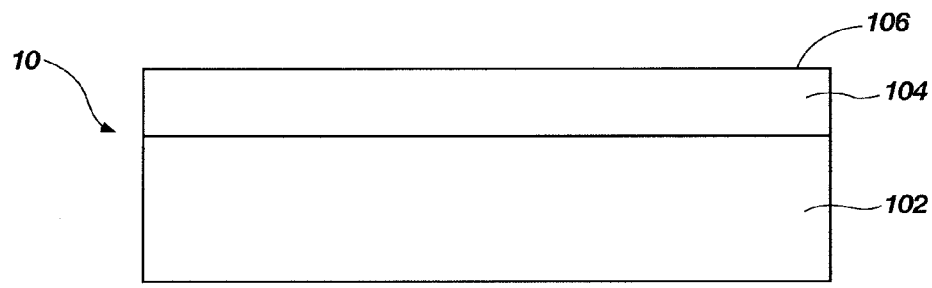
FIGS. 19-21 are cross-sectional views of an SMOI structure during various processing acts in accordance with another embodiment of the disclosure.
Figure 20:
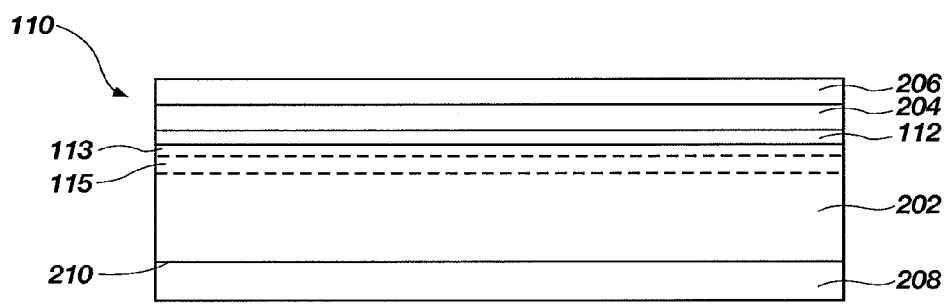
Figure 21:
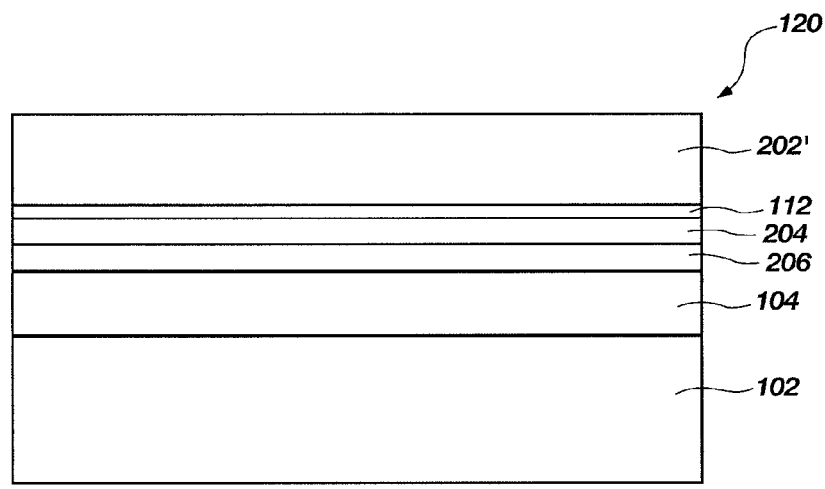

FIGS. 19 through 21 are partial cross-sectional views of another method of forming an embodiment of an SMOI structure 120 (FIG. 21) including the insulator material 104 and a high-k dielectric material 112. FIG. 19 is a substantial duplication of FIG. 1 and may be formed as described above regarding FIG. 1. As shown in FIG. 19, the acceptor wafer 10 includes the insulator material 104 formed over the first semiconductor substrate 102.

FIG. 20 is a partial cross-sectional view of one embodiment of a donor wafer 110 used to form the SMOI structure 120 (FIG. 21). The donor wafer 110 may be substantially similar to the donor wafer 20 described regarding FIG. 2 above and may be formed as described above regarding FIG. 2, with the exception that the donor wafer 110 includes a high-k dielectric material 112 disposed between the precursor semiconductor substrate 202 and the conductive material 204. The high-k dielectric material 112 may be formed of, for example, silicon dioxide, hafnium oxide, and other oxides, silicates, or aluminates of zirconium, aluminum, lanthanum, strontium, titanium, or combinations thereof including but not limited to $Ta_2O_5$, $ZrO_2$, $HfO_2$, $TiO_2$, $Al_2O_3$, $Y_2O_3$, $La_2O_3$, $HfSiO_x$, $ZrSiO_x$, $LaSiO_x$, $YSiO_x$, $ScSiO_x$, $CeSiO_x$, $HfLaSiO_x$, $HfAlO_x$, $ZrAlO_x$, and $LaAlO_x$. In addition, multi-metallic oxides may be used, as may hafnium oxynitride, iridium oxynitride and other high-k dielectric materials in either single or composite layers. The high-k dielectric material 112 may be formed on the precursor semiconductor substrate 202 using conventional deposition or in situ growth techniques and may include, for example, chemical vapor deposition (CVD), such as low pressure CVD or plasma enhanced CVD, atomic layer deposition (ALD), spin-on deposition, thermal decomposition, or thermal growth. Optionally, the donor wafer 110 may also include a metal 113 and a doped region 115. The metal 113 may include, for example, a reactive conductor such as metal mode titanium (MMTi), titanium (Ti), tantalum (Ta), cobalt (Co), and nickel (Ni). The conductive material 204 and the amorphous silicon material 206 may be deposited over the high-k dielectric material 112 and the precursor semiconductor substrate 202 may be implanted with an atomic species to form the implanted zone 210 and the cleave portion 208 as described above regarding FIG. 2.

As shown in FIG. 21, the donor wafer 110 may be superposed onto the acceptor wafer 10 and bonded thereto and the cleave portion 208 (FIG. 20) removed as previously described regarding FIGS. 3-6. The resulting SMOI structure 120 includes the substrate 102, an insulator material 104, the amorphous silicon material 206, the conductive material 204, the high-k dielectric material 112 and the second semiconductor substrate 202'.

Figure 22:
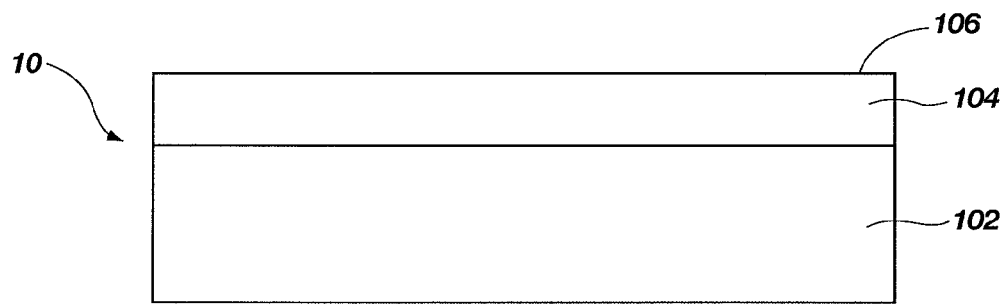
FIGS. 22-28 are cross-sectional views of an SMOI structure during various processing acts in accordance with another embodiment of the disclosure.

FIGS. 22 through 28 are cross-sectional views of a method of forming another embodiment of an SMOI structure 140 (FIG. 28) including a patterned conductive material 204'. FIG. 22 is a substantial duplication of FIG. 1 and may be formed as described above regarding FIG. 1. As shown in FIG. 22, the acceptor wafer 10 includes the insulator material 104 formed over the first semiconductor substrate 102.

Figure 23:
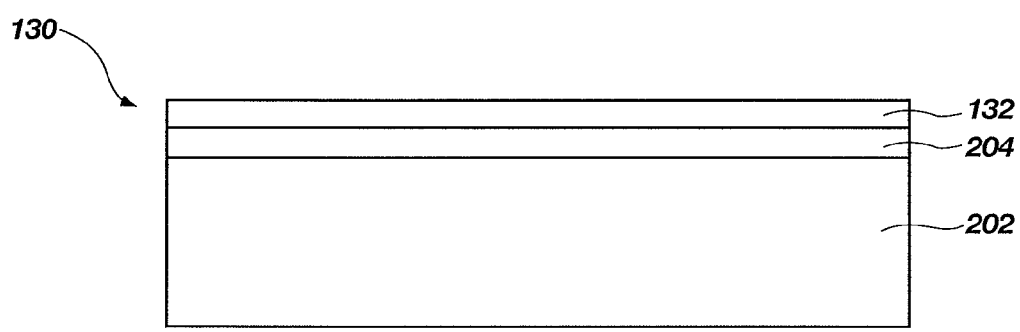
Figure 28:
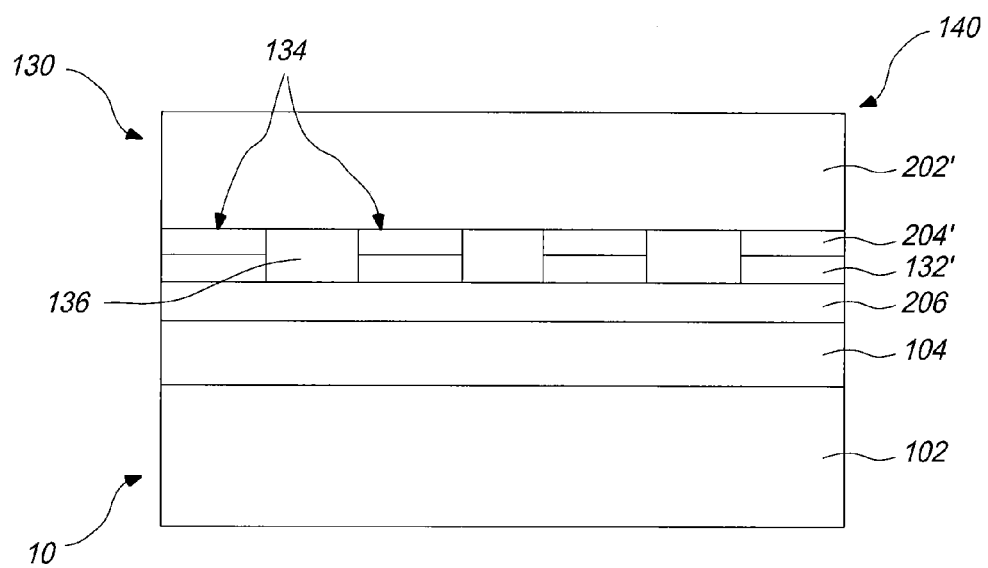

FIG. 23 is a partial cross-sectional view of one embodiment of a donor wafer 130 used to form the SMOI structure 140 (FIG. 28). The donor wafer 130 includes the precursor semiconductor substrate 202 having the conductive material 204 and a cap material 132 formed thereon. The cap material 132 may be formed of a dielectric material, such as a nitride material or an oxide material. The cap material 132 may be formed by deposition techniques known in the art including, but not limited to, ALD, CVD, or PVD.

Figure 24:
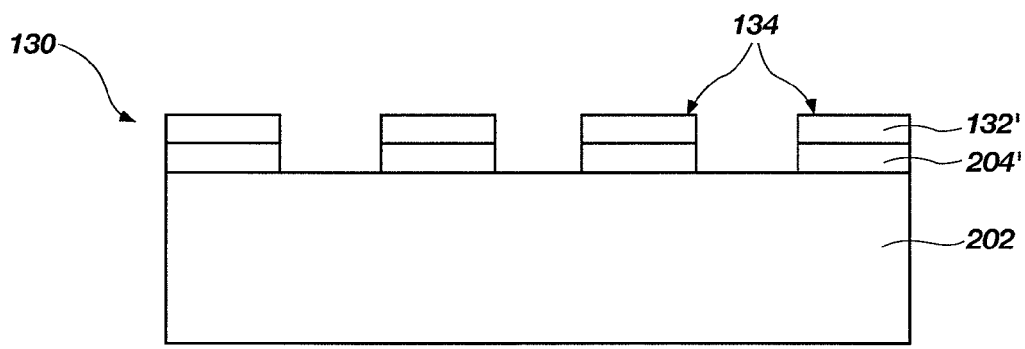
Figure 25:
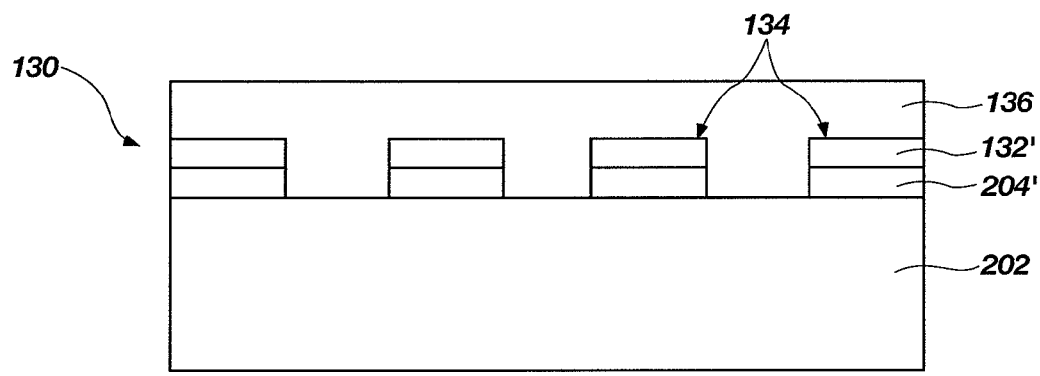
Figure 26:
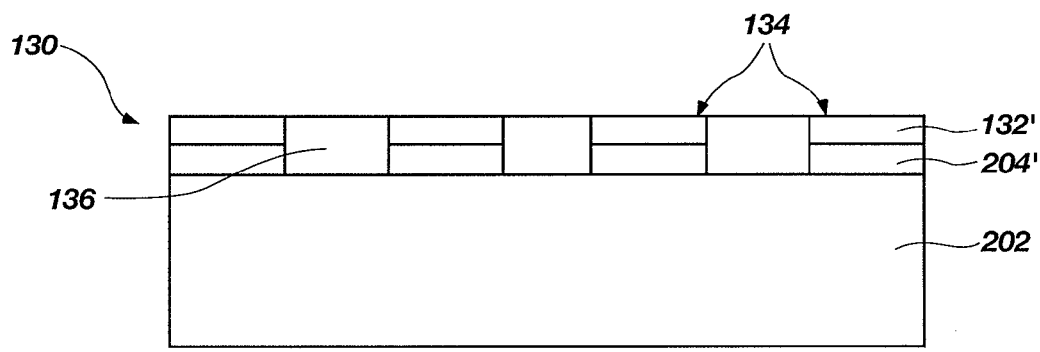

As shown in FIG. 24, the cap material 132 and the conductive material 204 may be patterned to form at least one structure 134 including the patterned cap material 132' and the patterned conductive material 204'. The cap material 132 and the conductive material 204 may be patterned using techniques known in the art, such as photoresist masking and anisotropic etching. Alternatively, in some embodiments, the patterned cap material 132' and the patterned conductive material 204' may be formed as at least one structure 134 using a damascene flow process, which is known in the art and is, therefore, not described in detail herein. As shown in FIG. 25, an interlevel dielectric material 136 may be deposited over the at least one structure 134 of the patterned cap material 132' and patterned conductive material 204'. The interlevel dielectric material 136 may be used to electrically isolate the at least one structure 134 from an adjacent structure 134. As shown in FIG. 26, the interlevel dielectric material 136 may be removed to expose an upper surface of the patterned cap material 132', such as by CMP, as known in the art. The patterned cap material 132' may act as a CMP stop.

Figure 27:
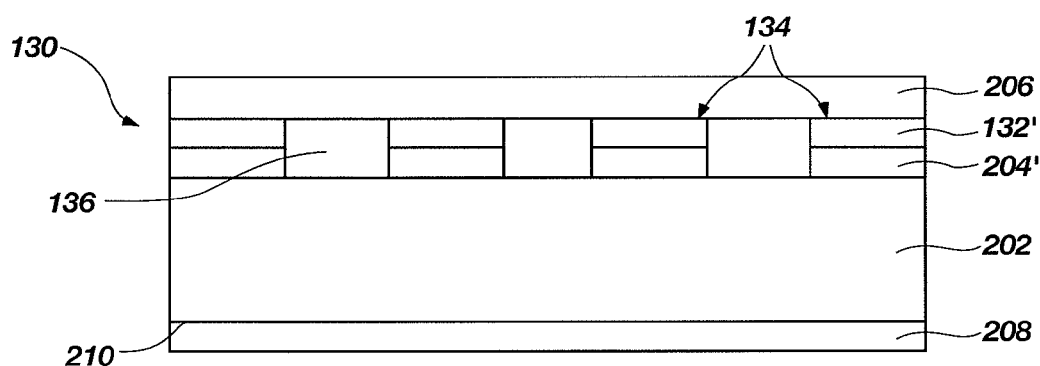

As shown in FIG. 27, the amorphous silicon material 206 may be formed over the interlevel dielectric material 136 and the patterned cap material 132'. The donor wafer 130 may also be implanted with an atomic species forming the implanted zone 210 and the cleave portion 208 as previously described regarding FIG. 2. As shown in FIG. 28, the donor wafer 130 may be superposed onto the acceptor wafer 10 and bonded thereto and the cleave portion 208 removed as previously described regarding FIGS. 3-6. The resulting SMOI structure 140 includes the first semiconductor substrate 102, the insulator material 104, the amorphous silicon material 206, at least one structure134 of the patterned cap material 132' and the conductive material 204', the at least one structure134 being electrically isolated by the interlevel dielectric material 136, and the second semiconductor substrate 202'. Because the pillars 134 including the conductive material 204' are patterned and separated by the interlevel dielectric material 136, the conductive material 204' may be used as an interconnect, such as a word line or a bit line without further processing, as described in greater detail below.

Figure 29:
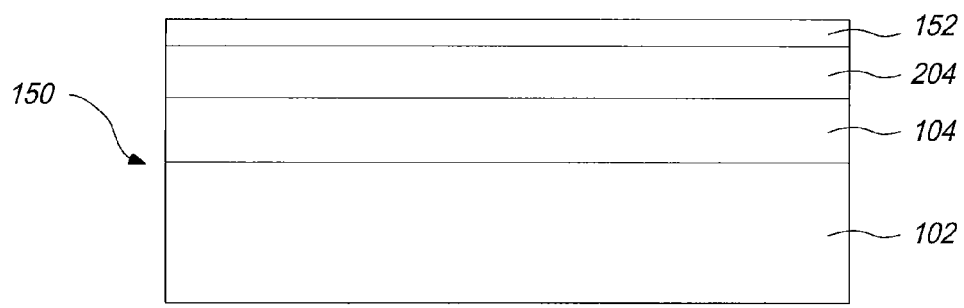
FIGS. 29-31 are cross-sectional views of an SMUT structure during various processing acts in accordance with another embodiment of the disclosure.
Figure 30:
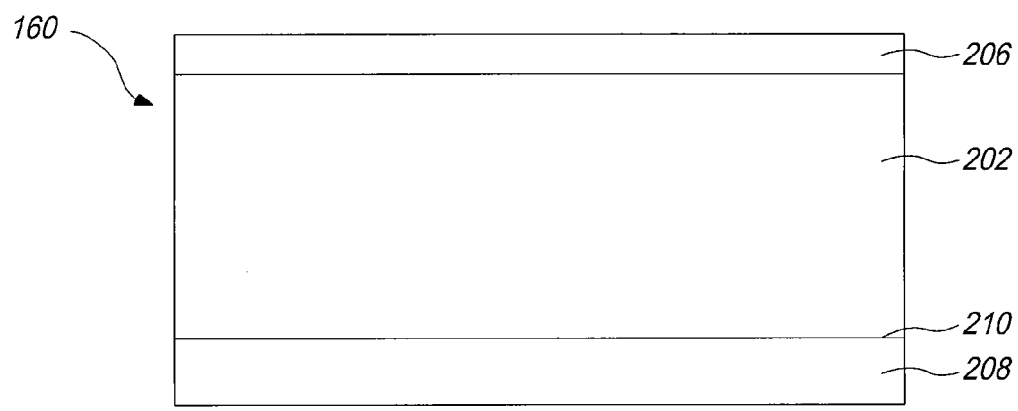
Figure 31:
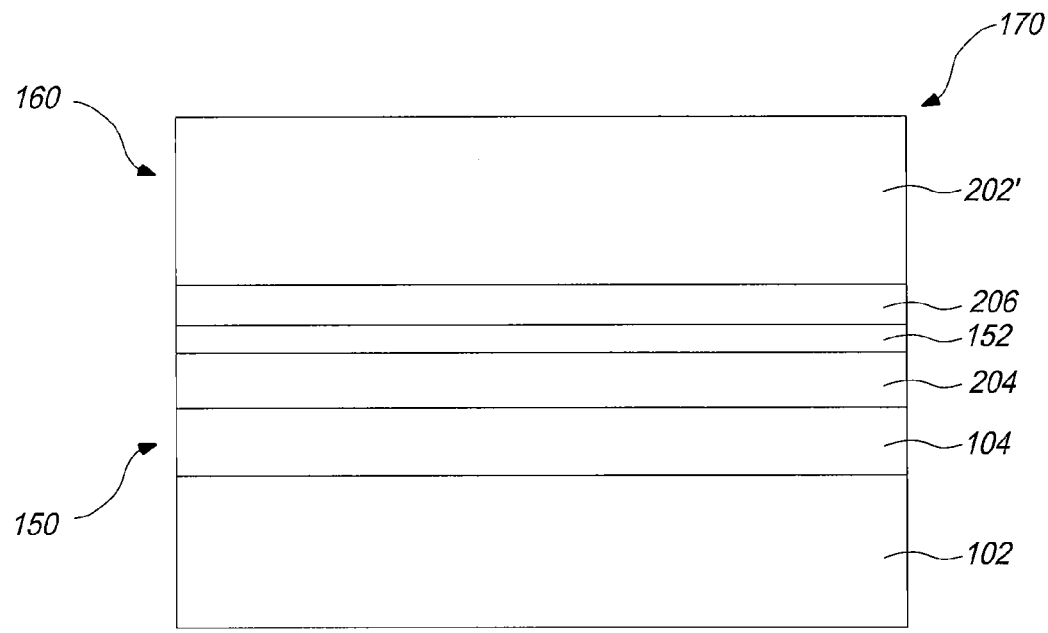

In additional embodiments, the conductive material 204 may be formed on an acceptor wafer rather than a donor wafer. For example, FIGS. 29-31 illustrate partial cross-sectional views of another method of forming an embodiment of an SMOI structure 170 (FIG. 31) including the conductive material 204. As shown in FIG. 29, an acceptor wafer 150 includes the first semiconductor substrate 102, the insulator material 104, and the conductive material 204. The acceptor wafer 150 may, optionally, include a bonding material 152. The bonding material 152 (if present) may be either an amorphous silicon material, as previously described, or the bonding material 152 may be an oxide material, such as silicon dioxide. In some embodiments, the conductive material 204 may be patterned and filled with an interlevel dielectric material (not shown) as described above regarding FIGS. 22-28.

FIG. 30 is a partial cross-sectional view of one embodiment of a donor wafer 160 used to form the SMOI structure 170 (FIG. 31). The donor wafer 160 may include the precursor semiconductor substrate 202 and the amorphous silicon material 206. The donor wafer 160 may be implanted with an atomic species forming the implanted zone 210 and the cleave portion 208 as previously described regarding FIG. 2.

As shown in FIG. 31, the donor wafer 160 may be superposed onto the acceptor wafer 150 and bonded thereto, and the cleave portion 208 may be removed as previously described regarding FIGS. 3-6. The resulting SMOI structure 170 includes the first semiconductor substrate 102, the insulator material 104, the conductive material 204, the bonding material 152 (if present) bonded to the amorphous silicon material 206, and the second semiconductor substrate 202'.

Figure 32:
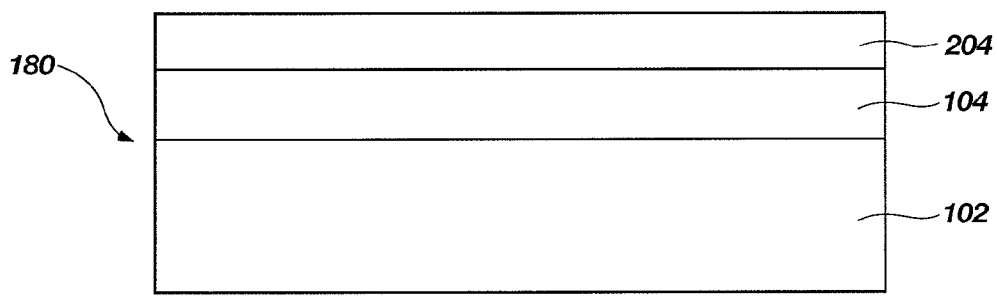
FIGS. 32-34 are cross-sectional views of an SMOI structure during various processing acts in accordance with another embodiment of the disclosure.
Figure 33:
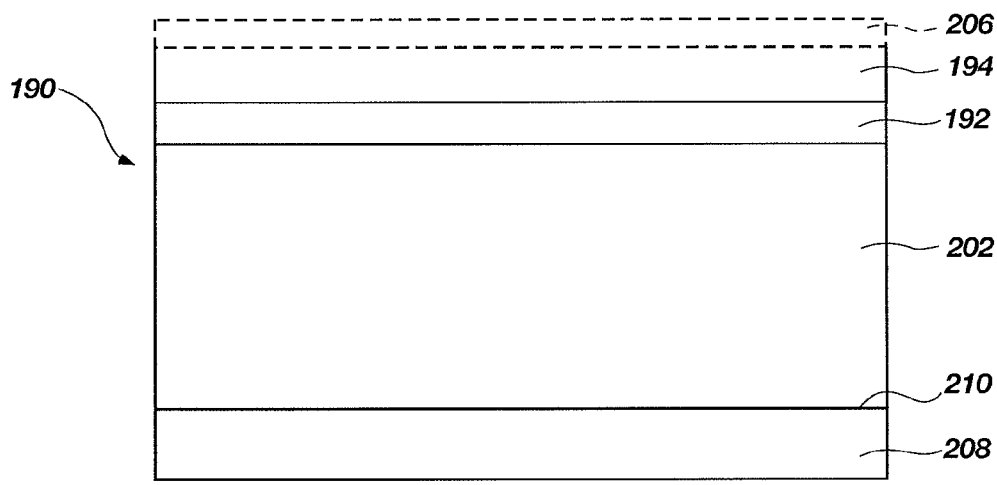
Figure 34:
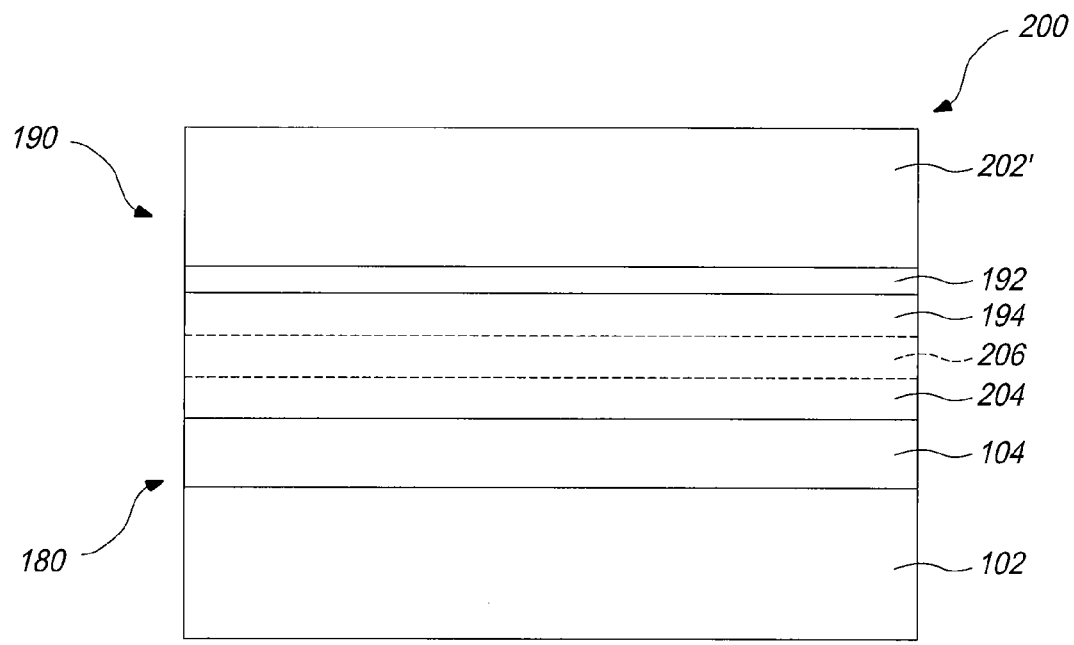

In additional embodiments, multiple SMOI structures may be formed by creating multiple layers of silicon material on a donor wafer. For example, FIGS. 32-34 illustrate partial cross-sectional views of another method of forming an embodiment of an SMOI structure 200 (FIG. 32) including a conductive material 204. As shown in FIG. 32, an acceptor wafer 180 includes the first semiconductor substrate 102, the insulator material 104, and the conductive material 204.

FIG. 33 is a partial cross-sectional view of one embodiment of a donor wafer 190 used to form the SMOI structure 200 (FIG. 34). The donor wafer 190 may include the precursor semiconductor substrate 202, at least one portion of a silicon-germanium (SiGe) material 192, and at least one portion of an epitaxial (EPI) silicon material 194. The SiGe material 192 and EPI silicon material 194 may be formed by methods known in the art and at any desired thickness. Additionaly, the SiGe material 192 and the EPI silicon material 194 may be doped or undoped. While FIG. 33 shows one portion of the SiGe material 192 and one portion of the EPI silicon material 194, multiple portions may be present by forming alternating portions of the SiGe material 192 and the EPI silicon material 194. In some embodiments, the amorphous silicon material 206, illustrated in dashed lines, may be optionally formed over the uppermost portion of the EPI silicon material 194 or the SiGe material 192. Alternatively, in some embodiments, the amorphous silicon material 206 may be omitted and the uppermost portion of the EPI silicon material 194 or the SiGe material 192 may be bonded to the acceptor wafer 180. The donor wafer 190 may also be implanted with an atomic species, forming the implanted zone 210 and the cleave portion 208 as previously described regarding FIG. 2.

As shown in FIG. 34, the donor wafer 190 may be superposed onto the acceptor wafer 180 and bonded thereto, and the cleave portion 208 may be removed as previously described regarding FIGS. 3-6. The resulting SMOI structure 200 includes the first semiconductor substrate 102, the insulator material 104, the conductive material 204, the amorphous silicon material 206 (if present), the at least one portion of the EPI silicon material 194, the at least one portion of the SiGe material 192, and the second semiconductor substrate 202'. While FIG. 33 is depicted as bonding the amorphous silicon material 206 to the conductive material 204, either of the EPI silicon material 194, the SiGe material 192, or the amorphous silicon material 206 (if present) may be used to bond the donor wafer 190 to the acceptor wafer 180. Once the SMOI structure 200 is formed, portions of the SiGe material 192 may be removed, such as, for example, utilizing a wet undercut etch. The portions of the SiGe material 192 that are removed may then be back filled with a dielectric material (not shown), such as an oxide material or the removed portions may be left unfilled, forming an air gap (not shown). Replacing portions of the SiGe material 192 with a dielectric material or an air gap may be used to form multiple SMOI structures on the substrate 102. In still further embodiments, the SMOI structure 200 may be formed without the conductive material 204, thus forming multiple SMOI structures on the substrate 102 without the conductive material 204.

Figure 35:
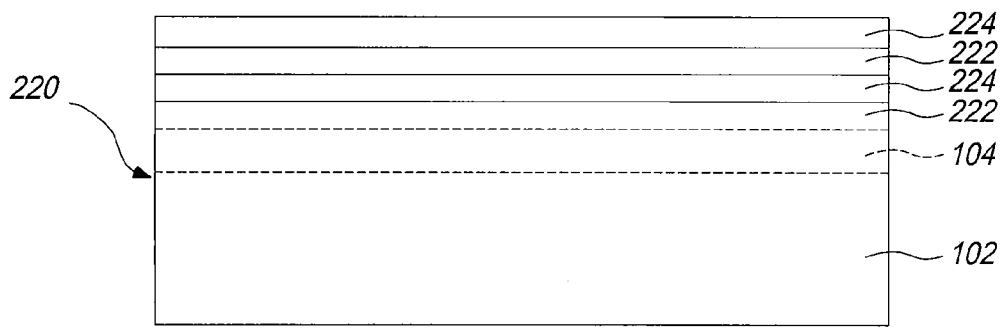
FIGS. 35-38 are cross-sectional views of an SMOI structure during various processing acts in accordance with another embodiment of the disclosure.

In additional embodiments, the SMOI structure may be formed with a multi-portion buried dielectric material. For example, FIGS. 35-38 illustrate partial cross-sectional views of another method of forming an embodiment of an SMOI structure 250 (FIG. 38) including a multi-portion buried dielectric material. As shown in FIG. 35, an acceptor wafer 220 includes the first semiconductor substrate 102, the insulator material 104, at least one portion of an oxide material 222, and at least one portion of a nitride material 224. In some embodiments, the insulator material 104 may, optionally, be omitted. The oxide material 222 and the nitride material 224 may be formed in alternating portions. The oxide material 222 and the nitride material 224 may be formed by methods known in the art and at any desired thickness. While FIG. 35 is illustrated as including two portions of the oxide material 222 alternating with two portions of the nitride material 224, it is understood that any number of portions of oxide material 222 and nitride material 224 may be present.

Figure 36:
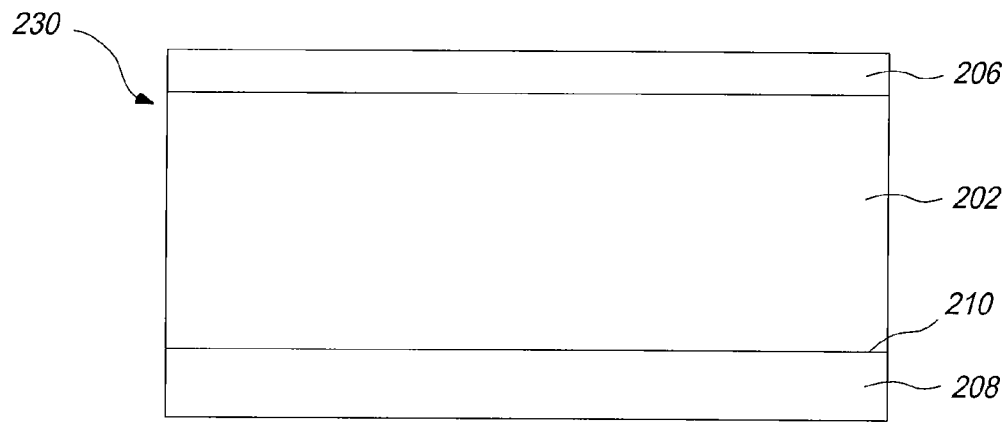
Figure 38:
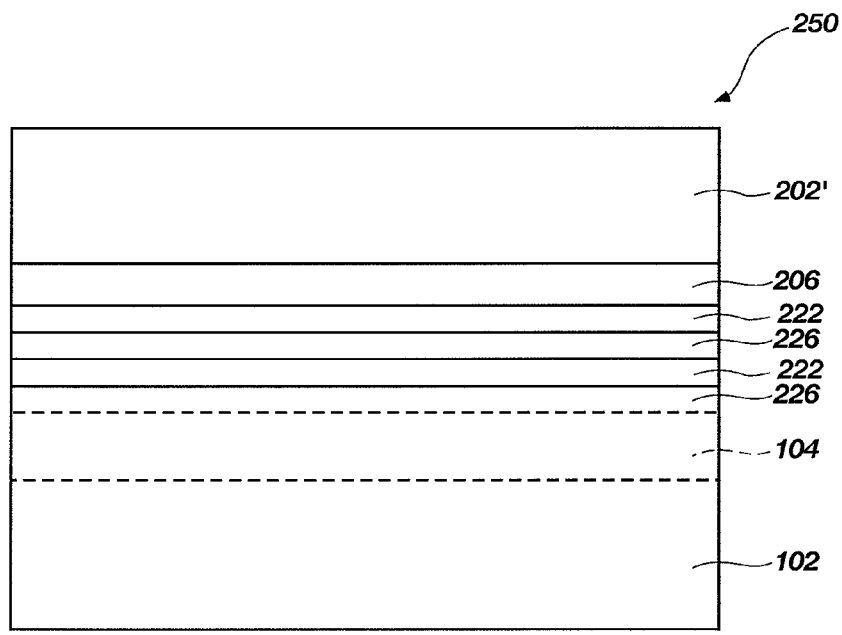

FIG. 36 is a partial cross-sectional view of one embodiment of a donor wafer 230 used to form the SMOI structure 250 (FIG. 38). The donor wafer 230 may be substantially similar to the donor wafer 20 described above in FIG. 2 and may be formed as described above regarding FIG. 2. As shown in FIG. 36, the donor wafer 230 may include the precursor semiconductor substrate 202 and the amorphous silicon material 206. The donor wafer 230 may also be implanted with an atomic species forming the implanted zone 210 and the cleave portion 208.

Figure 37:
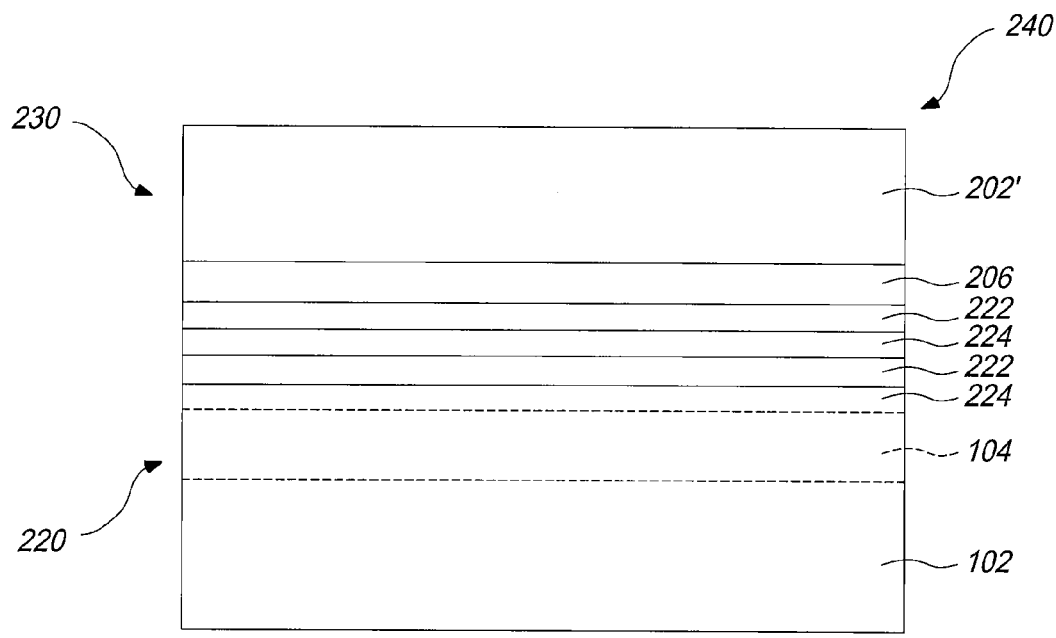

As shown in FIG. 37, the donor wafer 230 may be superposed onto the acceptor wafer 220 and bonded thereto, and the cleave portion 208 may be removed as previously described regarding FIGS. 3-6. A resulting SMOI structure 240 includes the first semiconductor substrate 102, the insulator material 104, at least one portion of the oxide material 222, at least one portion of the nitride material 224, the amorphous silicon material 206, and the second semiconductor substrate 202'. While FIG. 37 is depicted as bonding the amorphous silicon material 206 to the at least one portion of the oxide material 222, any of the at least one portion of the nitride material 224, the at least one portion of the oxide material 222, or an additional amorphous silicon material (not shown) may be used to bond the donor wafer 230 to the acceptor wafer 220. Once the SMOI structure 240 is formed, portions of the nitride material 224 may be selectively removed, such as, for example, by a selective undercut utilizing a wet etch. The portions of the nitride material 224 that are removed may then be back filled with a conductive material 226, forming the SMOI structure 250 shown in FIG. 38. Replacing the nitride material 224 with the conductive material 226 may be used to form an SMOI structure 250 having multiple layers of the conductive material 226, which is buried. While the layers of the conductive material 226 are shown as having equal thicknesses, it is understood that different layers of the conductive material 226 may have varying thicknesses depending on the desired use of the SMOI structure 250. The multiple layers of the conductive material 226 may be used to form multiple interconnects, such as word lines and bit lines. In additional embodiments, when forming a semiconductor device on/in the second semiconductor substrate 202', only the uppermost portion of the conductive material 226 may be utilized to form a semiconductor device as described in greater detail below, and the lower portions of conductive material 226 may remain intact. The lower portions of conductive material 226 that remain intact may help improve the bond strength and stability of the SMOI structure 250.

The SMOI structures 30, 50, 70, 90, 120, 140, 170, 200, 250 described herein may be utilized to form numerous semiconductor devices as known in the art including those described in U.S. Pat. No. 7,589,995 to Tang et al. entitled One-transistor Memory Cell with Bias Gate, U.S. Patent Application Publication No. 2007/0264771 to Ananthan et al. entitled Dual Work Function Recessed Access Device and Methods of Forming, U.S. patent application Ser. No. 12/410,207 to Tang et al. entitled Methods, Devices, and Systems Relating to Memory Cells Having a Floating Body, U.S. patent application Ser. No. 12/419,658 to Tang entitled Methods, Devices, and Systems Relating to Memory Cells Having a Floating Body. The disclosure of each of the foregoing documents is incorporated herein in its entirety by this reference. The SMOI structures 30, 50, 70, 90, 120, 140, 170, 200, 250 may be used to form any semiconductor device with two or more terminals. For example, the SMOI structures 30, 50, 70, 90, 120, 140, 170, 200, 250 may be used to form dynamic random access memory (DRAM), resistive, non-volatile RAM (ReRAM), phase change RAM (PCRAM), one-time programmable read-only memory (OTP ROM), or cache memory devices.

Figure 39:
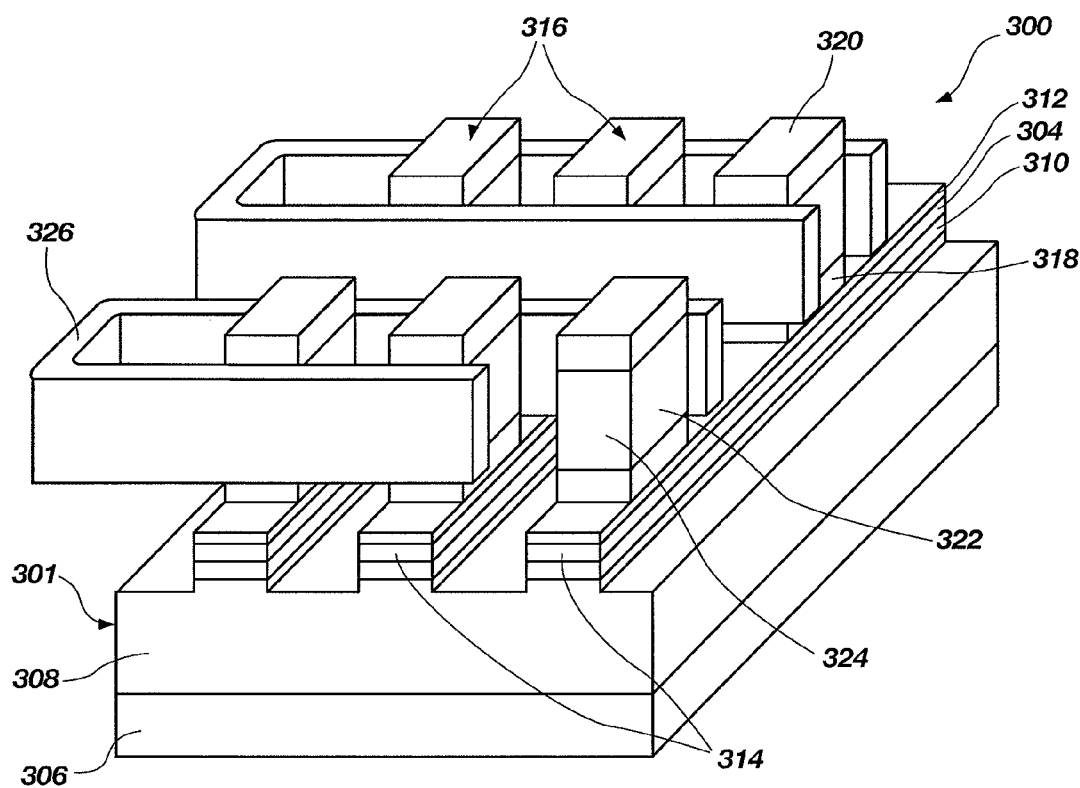
FIG. 39 is a perspective view of one embodiment of a semiconductor device including an SMOI structure of the disclosure.

FIG. 39 illustrates one example of an embodiment of a semiconductor device 300 including an SMOI structure 301 having a conductive material 304 buried beneath a second semiconductor substrate 312. The SMOI structure 301 may include, for example, a first semiconductor substrate 306, an insulator material 308, an amorphous silicon material 310, the conductive material 304, and the second semiconductor substrate 312. The SMOI structure 301 may be formed in a manner analogous to that described above in regard to FIG. 1-6, 7-10, 11-14, 15-18, 19-21, 22-28, 32-34, or 35-38.

The amorphous silicon material 310, the conductive material 304, and the second semiconductor substrate 312 may be patterned by conventional techniques in a first direction to form bit lines 314. Alternatively, if the SMOI structure 301 is formed in a manner analogous to that described above in regard to FIGS. 22-28, the conductive material 304 may already be patterned in the first direction. The second semiconductor substrate 312 may be patterned by conventional techniques in a second direction perpendicular to the first direction to form pillars 316 above the bit lines 314. The pillars 316 may be doped, as known in the art, to form a drain region 318, a source region 320, and a channel region 322. Alternatively, the second semiconductor substrate 312 may already be doped as previously described regarding FIGS. 11-14 and 15-18. Since the drain region 318, the source region 320, and the channel region 322 are formed vertically from the body of the pillars 316 and the pillar 316 is directly on top of the bit line 314, a higher device density may be achieved than with a conventional plan arrangement. A gate dielectric 324 may be formed on the sidewalls of the pillars 316 adjacent the channel regions 322. A gate 326 may also be formed on the sidewalls of the pillars 316 adjacent the gate dielectric 324. The gate dielectric 324 and the gate 326 may be formed using conventional techniques including conventional spacer etch techniques, which are not described in detail herein.

By utilizing the SMOI structure 301 to form the semiconductor device 300, the semiconductor device 300 may be formed in as few as three patterning acts. As previously described, the second semiconductor substrate 312 may be patterned in a first direction to form bit lines 314, the second semiconductor substrate 312 may be patterned in a second direction to form pillars 316 above the bit lines, and the gate 326 and the gate dielectric 324 may be patterned to form gate 326 and the gate dielectric 324 on the sidewalls of the pillars 316. Additionally, because the drain region 318, the source region 320, and the channel region 322 are formed from the pillar 316 above the bit line 314, no separate contact is needed to electrically connect the bit line 314 and the drain region 318. Furthermore, because a logic device (not shown) and back end of the line (BEOL) elements (not shown) may be formed on the first semiconductor substrate 306 prior to forming the semiconductor device 300, the semiconductor device 300 is not exposed to the processing conditions for forming the logic device and the BEOL elements. Avoiding exposure to such processing conditions may improve the reliability of the semiconductor device 300.

Figure 40:
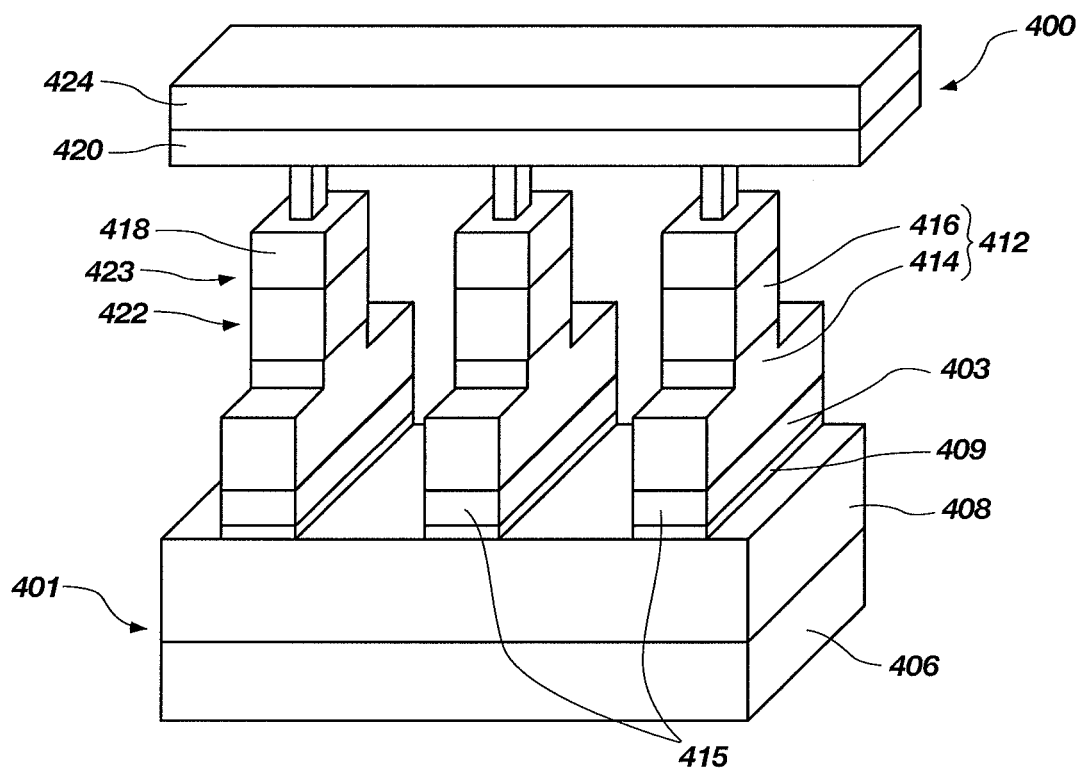
FIG. 40 is a perspective view of another embodiment of a semiconductor device including an SMOI structure of the disclosure.

FIG. 40 illustrates another embodiment of a semiconductor device 400 including an SMOI structure 401 having a conductive material 403 buried beneath a second semiconductor substrate 412. The semiconductor device 400 may include a memory cell coupled to an access device, such as a diode 422. The SMOI structure 401 may include, for example, a first semiconductor substrate 406, a dielectric material 408, an amorphous silicon material 409, the conductive material 403, and the second semiconductor substrate 412. The SMOI structure 401 may be formed in a manner analogous to that described above in regard to FIG. 1-6, 7-10, 11-14, 15-18, 19-21, 22-28, 32-34, or 35-38.

The amorphous silicon material 409, the conductive material 403, and the second semiconductor substrate 412 may be patterned by conventional techniques in a first direction to form word lines 415. Alternatively, if the SMOI structure 401 is formed in a manner analogous to that described above in regard to FIGS. 22-28, the conductive material 403 may already be patterned in the first direction. A portion of the second semiconductor substrate 412 may be patterned in a second direction by conventional techniques to form a pillar 423. The second semiconductor substrate 412 may be doped by conventional techniques to form the diode 422 over the word lines 415. For example, the second semiconductor substrate 412 may be formed of a single crystalline silicon material and may be doped to form an N doped silicon material 414 and a P doped silicon material 416. The N doped silicon material 414 may include a portion of the second semiconductor substrate 412 extending over the word lines 415 which is not etched in the second direction. The P doped silicon material 416 may include the portion of the second semiconductor substrate 412 etched in the second direction to form the pillar 423. Alternatively, the second semiconductor substrate may already be doped as previously described regarding FIGS. 11-14 and 15-18. A bottom electrode 418 for the memory device 400 may be formed over the diode 412 using conventional techniques. For example, in one embodiment, the material of the bottom electrode 418 may be deposited over the second semiconductor substrate 412 prior to patterning the second semiconductor substrate 412. The material of the bottom electrode 418 may then be patterned and etched, using conventional techniques, simultaneously with the patterning and etching of the second semiconductor substrate 412. A memory medium 420, and a terminal electrode or bit line 424 may be formed over the diode 422 and in electrical communication therewith, using conventional techniques, which are not described in detail herein.

By utilizing the SMOI structure 401 to form the semiconductor device 400, the semiconductor device 400 may be formed in as few as three patterning acts. As previously described, the amorphous silicon material 409, the conductive material 403, and the second semiconductor substrate 412 may be patterned in a first direction to form word lines 415; the second semiconductor substrate 412 and the bottom electrode 418 may be patterned in a second direction to form the diode 422 and the bottom electrode 418; and the memory medium 420 and the bit line 424 may be patterned to form the memory medium 420 and the bit line 424 above the diodes 422. Because the memory medium 420 is one of the last materials to be deposited, phase change or resistant change materials may be used as the memory medium 420 since the memory medium 420 may not be exposed to, and altered by, high processing temperatures.

Figure 41:
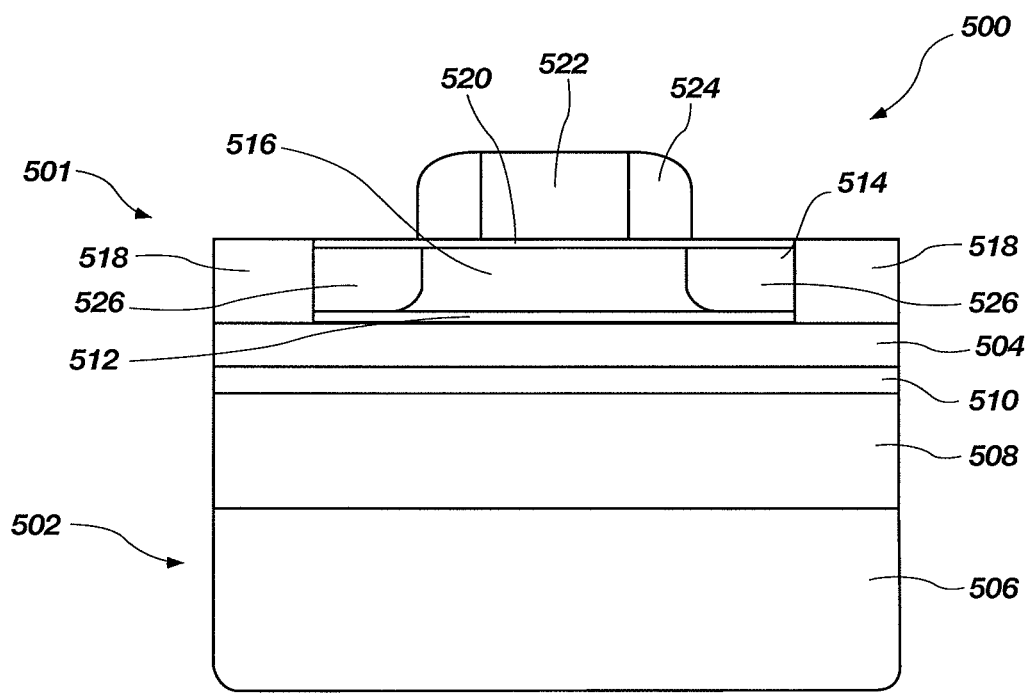
FIG. 41 is a cross-sectional view of another embodiment of a semiconductor device including an SMOI structure of the disclosure.

FIG. 41 illustrates another embodiment of a semiconductor device 500 including an SMOI structure 502 having a conductive material 504 buried beneath a second semiconductor substrate 514. The semiconductor device 500 may include a floating body memory cell 501 formed over and/or within the SMOI structure 502. The SMOI structure 502 may include, for example, a first semiconductor substrate 506, an insulator material 508, an amorphous silicon material 510, the conductive material 504, a high-k gate dielectric material 512, and the second semiconductor substrate 514. The SMOI structure 502 may be formed in a manner analogous to that described above in regard to FIGS. 29-31.

The floating body memory cell 501 includes an active region 516 surrounded on the sides by an additional insulator material 518. The active region 516 may be formed from the monocrystalline silicon of the second silicon substrate 514. The entire thickness of the second silicon substrate 514 may be used to form the floating body memory cell 501, the underlying high-k gate dielectric material 512 forming a back gate-dielectric and the conductive material 504 forming a metal back gate. Source and drain regions 526 may be formed by doping portions of the active region 516. The source and drain regions 526 will be doped differently than the active region 516. For example, the active region 516 may include P doped silicon while the source and drain regions 526 include N doped silicon.

As shown in FIG. 41, a second high-k material for a gate dielectric 520 is formed on the active region 516. The material for high-k gate dielectric 520 has a dielectric constant that is greater than that of silicon dioxide. Examples of a suitable material for high-k gate dielectric 520 include hafnium silicate, zirconium silicate, hafnium dioxide, or zirconium dioxide. A field-effect transistor (FET) gate 522 is formed on the high-k gate dielectric 520. The FET gate 522 and underlying high-k gate dielectric 520 may then be defined using conventional photolithographic techniques in combination with suitable etch processes, as known in the art. Spacers 524 may be formed flanking the sides of the FET gate 522 using conventional techniques, which are not described in detail herein.

By utilizing the SMOI structure 502 to form the semiconductor device 500, the floating body memory cell 501 may be formed in electrical communication with the conductive material 504, thus eliminating the need for an additional electrical contact between the floating body memory cell 501 and the conductive material 504. Additionally, because a logic device (not shown) and back end of the line (BEOL) elements (not shown) may be formed on the first semiconductor substrate 506 prior to forming floating body memory cell 501, the floating body memory cell 501 is not exposed to the processing conditions used to form the logic device and the BEOL elements. Avoiding exposure to such processing conditions may improve the reliability of the semiconductor device 500.

Figure 42:
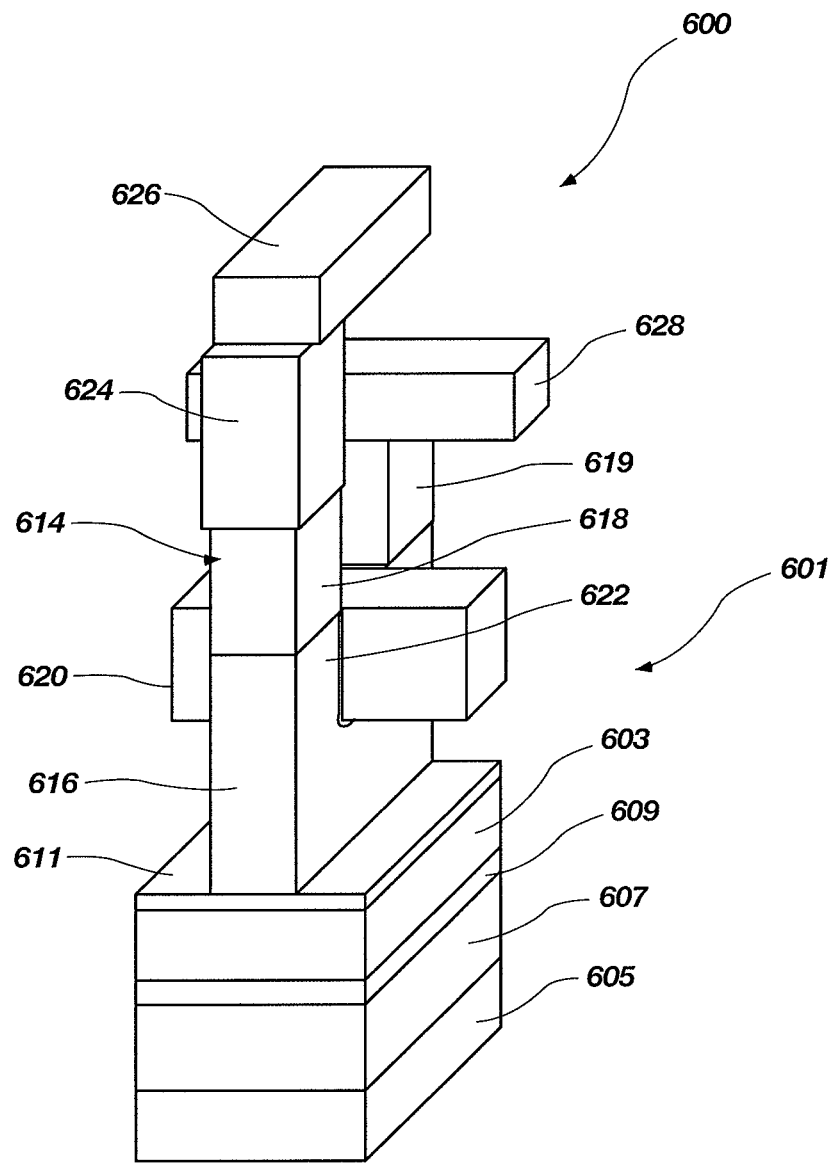
FIG. 42 is a perspective view of another embodiment of a semiconductor device including an SMOI structure of the disclosure.

FIG. 42 illustrates another embodiment of a semiconductor device 600 including an SMOI structure 601 having a conductive material 603 buried beneath a second semiconductor substrate 614. The SMOI structure 601 may include, for example, a first semiconductor substrate 605, an insulator material 607, an amorphous silicon material 609, the conductive material 603, a dielectric material 611 and a second semiconductor substrate 614. The SMOI structure 601 may be formed in a manner analogous to that described above in regard to FIGS. 29-31.

The second semiconductor substrate 614 may be patterned and doped, as known in the art, to form a floating body region 616, a drain region 618 and a source region 619. The second semiconductor substrate 614 may be further patterned to form a recess in the floating body region 616 between the drain region 618 and the source region 619. A word line 620 may be formed in the recess. A dielectric material 622 may be formed between the word line 620 and the floating body region 616. The buried conductive material 603 acts as a buried gate for the memory cell. A contact 624 may be formed above the drain region 618 leading to a bit line 626. The contact 624 may comprise, for example, a N+ doped polysilicon plug or a metal plug. A common source 628 may be formed above the source region 619.

Figure 43:
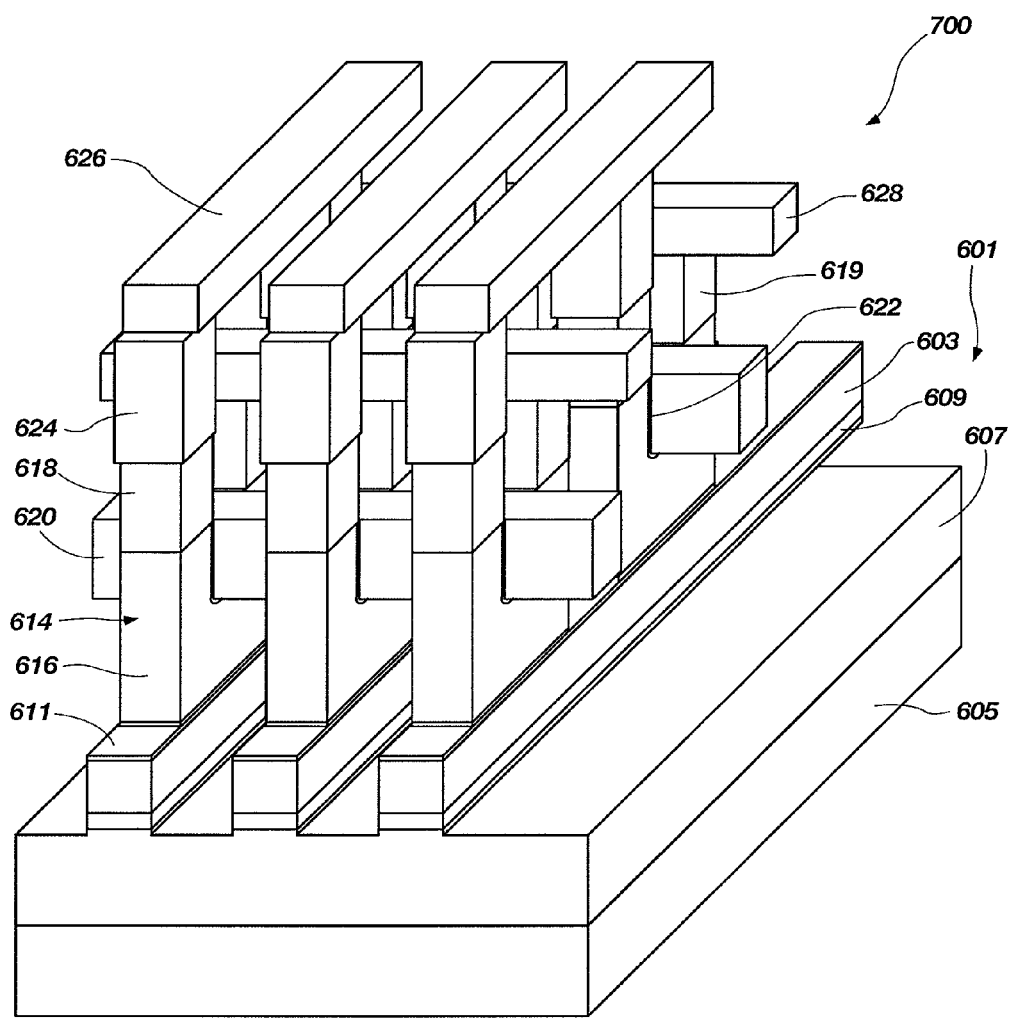
FIG. 43 is a perspective view of another embodiment of a semiconductor device including an SMOI structure of the disclosure.

FIG. 43 illustrates a semiconductor device 700 including a plurality of the semiconductor devices 600 (FIG. 42). As illustrated in FIG. 43, the amorphous silicon material 609, the conductive material 603 and the dielectric material 611 may also be etched to form rows which are parallel to the bit lines 626. Similarly, in additional embodiments, the amorphous silicon material 609, the conductive material 603 and the dielectric material 611 may be etched to form rows (not shown) which are parallel to the bit lines 626.

By utilizing the SMOI structure 601 to form the semiconductor device 700, the floating body region 616 may be formed on top of the conductive material 603, thus eliminating the need for an additional electrical contact between the floating body region 616 and the conductive material 603. Additionally, because a logic device (not shown) and back end of the line (BEOL) elements (not shown) may be formed on the first semiconductor substrate 605 prior to forming floating body region 616, the floating body region 616 is not exposed to the processing conditions used for forming the logic device and the BEOL elements. Avoiding exposure of the floating body region 616 to such processing conditions may improve the reliability of the semiconductor device 600.

Figure 44:
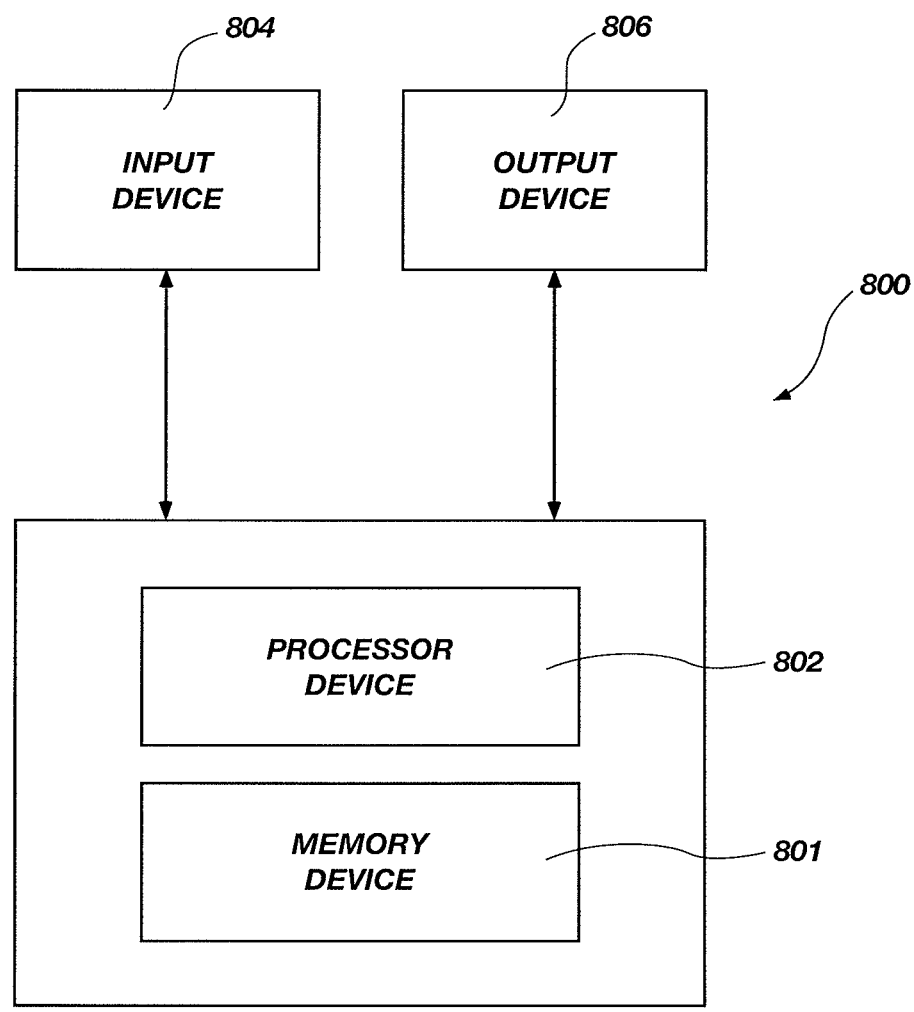
FIG. 44 is a schematic block diagram illustrating one embodiment of an electronic system that includes a semiconductor device including an SMOI structure of the disclosure.

Semiconductor devices, such as those previously described herein, may be used in embodiments of electronic systems of the present invention. For example, FIG. 44 is a schematic block diagram of an illustrative electronic system 800 according to the present invention. The electronic system 800 may comprise, for example, a computer or computer hardware component, a server or other networking hardware component, a cellular telephone, a digital camera, a personal digital assistant (PDAs), portable media (e.g., music) player, etc. The electronic system 800 includes at least one memory device 801. The electronic system 800 further may include at least one electronic signal processor device 802 (often referred to as a "microprocessor"). At least one of the electronic signal processor device 802 and the at least one memory device 801 may comprise, for example, an embodiment of the semiconductor device 300, 400, 500, 600, 700 described above. In other words, at least one of the electronic signal processor device 802 and the at least one memory device 801 may comprise an embodiment of a semiconductor device including an SMOI structure having a buried conductive material as previously described in relation to the semiconductor devices 300, 400, 500, 600, 700 shown in FIGS. 39-43. The electronic system 800 may further include one or more input devices 804 for inputting information into the electronic system 800 by a user, such as, for example, a mouse or other pointing device, a keyboard, a touchpad, a button, or a control panel. The electronic system 800 may further include one or more output devices 806 for outputting information (e.g., visual or audio output) to a user such as, for example, a monitor, a display, a printer, an audio output jack, a speaker, etc. In some embodiments, the input device 804 and the output device 806 may comprise a single touchscreen device that can be used both to input information to the electronic system 800 and to output visual information to a user. The one or more input devices 804 and output devices 806 may communicate electrically with at least one of the memory device 801 and the electronic signal processor device 802.

CONCLUSION

In some embodiments, the present invention includes semiconductor-metal-on-insulator (SMOI) structures, devices including such structures and methods for forming such structures. The SMOI structures may include an insulator material on a first semiconductor substrate, an amorphous silicon material bonded to the insulator material, a conductive material over the amorphous silicon material and a second semiconductor substrate over the conductive material. A dielectric material may also be disposed between the conductive material and the second semiconductor substrate.

In other embodiments, the conductive material may be patterned and adjacent portions of the patterned conductive material may be separated from one another by a dielectric material.

In additional embodiments, the present invention includes an SMOI that includes an insulator material on a first semiconductor substrate, an amorphous germanium material bonded to the insulator material, a conductive material over the amorphous germanium material and a second semiconductor substrate over the conductive material.

In additional embodiments, the present invention includes an SMOI structure that includes an insulator material on a first semiconductor substrate, a conductive material over the insulator material, at least one portion of an epitaxial silicon material and at least one portion of a silicon-germanium material, the at least one portion of the epitaxial silicon material or the at least one portion of the silicon-germanium material bonded to the insulator material, and a second semiconductor substrate over the conductive material. The insulator material may be formed of an oxide material having an amorphous silicon material formed thereon.

In additional embodiments, the present invention includes an SMOI structure including a first semiconductor substrate, at least one portion of an oxide material and at least one portion of a conductive material formed over the first semiconductor substrate, and a second semiconductor substrate formed over the conductive material.

In yet further embodiments, the present invention includes a semiconductor device that includes an insulator material on a first semiconductor substrate, an amorphous silicon material bonded to the insulator material, a conductive material over the amorphous silicon material, a second semiconductor substrate over the conductive material, and a memory cell on the second silicon substrate. The conductive material may form an interconnect. A logic device may also be formed on the first semiconductor substrate. In some embodiments, a dielectric material may be disposed between the conductive material and the second semiconductor substrate. The memory cell of the semiconductor device may include a floating body memory cell which includes an active area substantially physically isolated by an insulating material, a drain region and a source region formed within the active area, a high-k dielectric material formed on an active area between the drain region and the source region and a metal gate formed on the high-k dielectric.

In yet further embodiments, the present invention includes methods of forming an SMOI structure that include forming an acceptor wafer comprising an insulator material formed over a first semiconductor substrate, forming a donor wafer comprising a conductive material over a precursor semiconductor substrate, an amorphous silicon material over the conductive material, and an implanted zone within the precursor semiconductor substrate, bonding the amorphous silicon material of the donor wafer to the insulator material of the acceptor wafer, and removing a portion of the precursor semiconductor substrate proximate the implanted zone within the precursor semiconductor substrate. In some embodiments, at least one surface of the amorphous silicon material and a surface of the insulator material may be treated with a chemical, a plasma, or an implant activation before bonding the amorphous silicon material of the donor wafer to the insulator material.

In yet further embodiments, the present invention includes a method of fabricating a semiconductor device including forming an acceptor wafer comprising an insulator material formed over a first semiconductor substrate, forming a donor wafer comprising a conductive material over a precursor semiconductor substrate, an amorphous silicon material over the conductive material, and an implanted zone within the precursor semiconductor substrate, bonding the amorphous silicon material of the donor wafer to the insulator material of the acceptor wafer, removing a portion of the precursor semiconductor substrate proximate the implanted zone to form a second semiconductor substrate, and fabricating at least one memory cell on the second semiconductor substrate.

In yet further embodiments, the present invention includes methods of forming an SMOI structure that include forming an acceptor wafer comprising an insulator material formed over a first semiconductor substrate, forming a donor wafer comprising a conductive material over a precursor semiconductor substrate, an amorphous germanium material over the conductive material, and an implanted zone within the precursor semiconductor substrate, bonding the amorphous germanium material of the donor wafer to the insulator material of the acceptor wafer, and removing a portion of the precursor semiconductor substrate proximate the implanted zone within the precursor semiconductor substrate.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A semiconductor device comprising:
    an insulator material elevationally outward of and contacting first semiconductive material;
    amorphous silicon elevationally outward of and contacting the insulator material;
    a conductive material elevationally outward of and contacting the amorphous silicon, the conductive material being selected from the group consisting of a phase change material, titanium, titanium oxide, tantalum, tantalum oxide, tantalum nitride, and tungsten oxide;
    second semiconductive material elevationally outward of the conductive material; and
    a floating body memory cell comprising:
        an active area comprising the second semiconductive material, insulating material on opposite sides of the active area;
        a drain region and a source region within the second semiconductive material of the active area;
        a first high-k dielectric material elevationally outward of and contacting the second semiconductive material of the active area between the drain region and the source region;
        a transistor gate elevationally outward of and contacting the first high-k dielectric material;
        a second high-k dielectric material elevationally between and contacting the conductive material and the second semiconductive material, the second high-k dielectric material contacting bottom surfaces of the drain region and the source region and of the second semiconductive material there-between, a bottom surface of the second high-k material contacting the conductive material along an entirety of a lateral width of the bottom surface; and
        the conductive material extending laterally beyond lateral outermost edges of each of the drain region and the source region.

2. The semiconductor device of claim 1 wherein the transistor gate comprises metal.

3. The semiconductor device of claim 1, wherein the amorphous silicon extends laterally beyond the lateral outermost edges of each of the drain region and the source region.

4. The semiconductor device of claim 1, wherein the conductive material is elevationally between the insulating material that is on opposite sides of the active area and the amorphous silicon and extends along and contacts bottom surfaces of the insulating material that is on opposite sides of the active area.

5. A semiconductor-metal-on-insulator structure comprising:
    a first wafer comprising an insulator material contacting semiconductive material;
    a second wafer comprising amorphous silicon and semiconductive material, the second wafer comprising conductive material elevationally between the amorphous silicon and the semiconductive material of the second wafer, the conductive material being in direct contact with the amorphous silicon and being selected from the group consisting of a phase change material, titanium, titanium oxide, tantalum, tantalum oxide, tantalum nitride, and tungsten oxide;
    the first and second wafers being adhered to one another with the amorphous silicon material of the second wafer and the insulator material of the first wafer contacting one another, the amorphous silicon being elevationally between the conductive material and the insulator material, the insulator material being elevationally between the semiconductive material of the first wafer and the amorphous silicon; and
    a semiconductor device formed on or within the semiconductive material of the second wafer.

6. The semiconductor-metal-on-insulator structure of claim 5, wherein the conductive material is a first conductive material and further comprising a second conductive material elevationally between the first conductive material and the semiconductive material of the second wafer.

7. The semiconductor-metal-on-insulator structure of claim 6, wherein the second conductive material comprises titanium-rich titanium nitride in contact with the semiconductive material of the second substrate and tungsten silicide over the second semiconductive material.

8. The semiconductor-metal-on-insulator structure of claim 6, wherein the first conductive material comprises a metal other than titanium and a titanium material.

9. The semiconductor-metal-on-insulator structure of claim 8, wherein the metal other than titanium is tungsten.

10. The semiconductor-metal-on-insulator structure of claim 8, wherein the metal other than titanium is aluminum.

11. The semiconductor-metal-on-insulator structure of claim 5, wherein the first and second wafers are each a full and unpatterned wafer.

12. A semiconductor device comprising:
    an insulator material elevationally outward of and contacting first semiconductive material;
    amorphous silicon elevationally outward of and contacting the insulator material;
    a conductive material elevationally outward of and contacting the amorphous silicon, the conductive material being selected from the group consisting of a phase change material, titanium, titanium oxide, tantalum, tantalum oxide, tantalum nitride, and tungsten oxide;
second semiconductive material elevationally outward of the conductive material; and
a floating body memory cell comprising:
- an active area comprising the second semiconductive material, insulating material on opposite sides of the active area;
- a drain region and a source region within the second semiconductive material of the active area;
- a first high-k dielectric material elevationally outward of and contacting the second semiconductive material of the active area between the drain region and the source region;
- a transistor gate elevationally outward of and contacting the first high-k dielectric material;
- a second high-k dielectric material elevationally between and contacting the conductive material and the second semiconductive material, the second high-k dielectric material contacting bottom surfaces of the drain region and the source region and of the second semiconductive material there-between, a bottom surface of the second high-k material contacting the conductive material along an entirety of a lateral width of the bottom surface; and
- the amorphous silicon extending laterally beyond lateral outermost edges of each of the drain region and the source region.

13. The semiconductor device of claim 12, wherein the conductive material is elevationally between the insulating material that is on opposite sides of the active area and the amorphous silicon and extends along and contacts bottom surfaces of the insulating material that is on opposite sides of the active area.

14. A semiconductor device comprising:
an insulator material elevationally outward of and contacting first semiconductive material;
amorphous silicon elevationally outward of and contacting the insulator material;
a conductive material elevationally outward of and contacting the amorphous silicon, the conductive material being selected from the group consisting of a phase change material, titanium, titanium oxide, tantalum, tantalum oxide, tantalum nitride, tungsten, tungsten silicide, and tungsten oxide;
second semiconductive material elevationally outward of the conductive material; and
a floating body memory cell comprising:
- an active area comprising the second semiconductive material, insulating material on opposite sides of the active area;
- a drain region and a source region within the second semiconductive material of the active area;
- a first high-k dielectric material elevationally outward of and contacting the second semiconductive material of the active area between the drain region and the source region;
- a transistor gate elevationally outward of and contacting the first high-k dielectric material;
- a second high-k dielectric material elevationally between and contacting the conductive material and the second semiconductive material, the second high-k dielectric material contacting bottom surfaces of the drain region and the source region and of the second semiconductive material there-between, a bottom surface of the second high-k material contacting the conductive material along an entirety of a lateral width of the bottom surface; and
- the conductive material being elevationally between the insulating material that is on opposite sides of the active area and the amorphous silicon and extending along and contacting bottom surfaces of the insulating material that is on opposite sides of the active area.

* * * * *